(12) United States Patent
Uochi

(10) Patent No.: US 9,099,437 B2
(45) Date of Patent: Aug. 4, 2015

(54) SEMICONDUCTOR DEVICE

(75) Inventor: Hideki Uochi, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 44 days.

(21) Appl. No.: 13/406,996

(22) Filed: Feb. 28, 2012

(65) Prior Publication Data

US 2012/0228615 A1 Sep. 13, 2012

(30) Foreign Application Priority Data

Mar. 8, 2011 (JP) ................................ 2011-050032

(51) Int. Cl.
*H01L 29/10* (2006.01)
*H01L 29/423* (2006.01)
*G11C 11/403* (2006.01)
(Continued)

(52) U.S. Cl.
CPC .......... *H01L 29/42384* (2013.01); *G11C 5/063* (2013.01); *G11C 11/403* (2013.01); *H01L 21/84* (2013.01); *H01L 27/10873* (2013.01); *H01L 27/1108* (2013.01); *H01L 27/1156* (2013.01); *H01L 27/12* (2013.01); *H01L 29/4908* (2013.01); *H01L 29/7869* (2013.01); *H01L 29/78606* (2013.01); *H01L 29/78618* (2013.01); *H01L 29/78642* (2013.01); *H01L 29/78696* (2013.01); *G11C 11/412* (2013.01); *G11C 16/0433* (2013.01)

(58) Field of Classification Search
USPC ............................................. 257/43, 57, 75
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Lin et al, Novel carbon Nanotube FET, IBM T. J. Watson Research Center, Yorktown Heights,NY 10598.*
(Continued)

*Primary Examiner* — Matthew W Such
*Assistant Examiner* — Ali Naraghi
(74) *Attorney, Agent, or Firm* — Eric J. Robinson; Robinson Intellectual Property Law Office, P.C.

(57) ABSTRACT

A semiconductor device in which a semiconductor layer is formed over a gate electrode with a large aspect ratio, thereby obtaining a channel length of a transistor which hardly causes a short-channel effect even when the transistor is miniaturized. A lower electrode is provided under the gate electrode with an insulating layer provided therebetween so that the electrode overlaps with the semiconductor layer. A potential (electric field) of the lower electrode imparts a conductivity type to the semiconductor layer overlapping with the lower electrode, so that a source region and a drain region are formed in the semiconductor layer. The gate electrode serves as a shield, so that a region in the semiconductor layer, which faces the gate electrode with the gate insulating layer provided therebetween, is not influenced by the electric field from the lower electrode.

18 Claims, 11 Drawing Sheets

(51) Int. Cl.

| | | |
|---|---|---|
| *H01L 21/84* | (2006.01) | |
| *H01L 27/108* | (2006.01) | |
| *H01L 27/11* | (2006.01) | |
| *H01L 27/115* | (2006.01) | |
| *H01L 29/49* | (2006.01) | |
| *H01L 29/786* | (2006.01) | |
| *G11C 5/06* | (2006.01) | |
| *H01L 27/12* | (2006.01) | |
| *G11C 11/412* | (2006.01) | |
| *G11C 16/04* | (2006.01) | |

(56) References Cited

U.S. PATENT DOCUMENTS

| | | |
|---|---|---|
| 6,040,595 A | 3/2000 | Yang |
| 6,294,274 B1 | 9/2001 | Kawazoe et al. |
| 6,563,174 B2 | 5/2003 | Kawasaki et al. |
| 6,635,526 B1 | 10/2003 | Malik et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,419,858 B2 * | 9/2008 | Schuele et al. ............ 438/163 |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,795,096 B2 | 9/2010 | Wang |
| 7,846,826 B2 | 12/2010 | Oyu et al. |
| 8,164,138 B2 | 4/2012 | Lee |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0232408 A1 | 11/2004 | Heeger et al. |
| 2004/0232495 A1 | 11/2004 | Saito et al. |
| 2005/0017302 A1 | 1/2005 | Hoffman |
| 2005/0199959 A1 | 9/2005 | Chiang et al. |
| 2005/0250262 A1 * | 11/2005 | Suzuki et al. ............ 438/151 |
| 2005/0275038 A1 * | 12/2005 | Shih et al. ............ 257/382 |
| 2006/0035452 A1 | 2/2006 | Carcia et al. |
| 2006/0043377 A1 | 3/2006 | Hoffman et al. |
| 2006/0084255 A1 | 4/2006 | Oyu et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0145474 A1 * | 6/2007 | Annese et al. ............ 257/329 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278540 A1 | 12/2007 | Hoshino et al. |
| 2007/0287296 A1 | 12/2007 | Chang |
| 2007/0296031 A1 | 12/2007 | Tanaka |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057649 A1 | 3/2008 | Schuele et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256237 A1 | 10/2009 | Kobayashi |
| 2009/0278122 A1 | 11/2009 | Hosono et al. |
| 2009/0280600 A1 | 11/2009 | Hosono et al. |
| 2009/0315138 A1 | 12/2009 | Chang et al. |
| 2010/0013018 A1 * | 1/2010 | Jeon et al. ............ 257/368 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2010/0219411 A1 * | 9/2010 | Hoffman et al. ............ 257/43 |
| 2012/0025304 A1 | 2/2012 | Blank et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0223306 A1 | 9/2012 | Saito et al. |
| 2012/0223310 A1 | 9/2012 | Noda et al. |
| 2012/0235150 A1 | 9/2012 | Isobe et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110095 | 4/1993 |
| JP | 05-110096 | 4/1993 |
| JP | 05-110097 | 4/1993 |
| JP | 05-110098 | 4/1993 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Li et al, Preferential Growth of semiconducting single-walled Carbon Nanotube, Department of chemistry for Advanced Material, Stanford University, Stanfod California 94305.*

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05; Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Syposium Digest of Technical Papers, May 20, 2008, vol. 39, pp. 625-628.

Nowatari.H et al., "60.2: Intermediate Connector With Suppressed Voltage Loss for White Tandem OLEDS,", Sid Digest '09 : SID International Syposium Digest of Technical Papers, May 31, 2009, vol. 40 pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009 pp. 395-398.

Lee.H et al., "Current Status of, Challenges to, and Perspective View of AM-OLED ,", IDW '06 : Proceedings of the 13th International Display Workshops, Dec. 7, 2006, pp.663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.n. et al., "Spinel,YbFe2O4, and Yb2Fe3O7 Types of Structures for Compounds in the IN2O3 and SC2O3—A2O3—BO Systems [A; Fe, Ga, or Al; B: Mg, Mn, Fe, Ni, Cu, or Zn] at temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B.(Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys.Lett. (Applied Physics Letters) , Sep. 1, 2003, vol. 83, No. 9, pp. 1755-1757.

\* cited by examiner

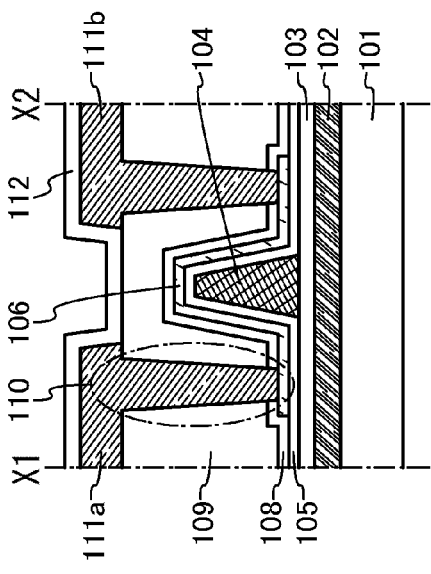
FIG. 1B1
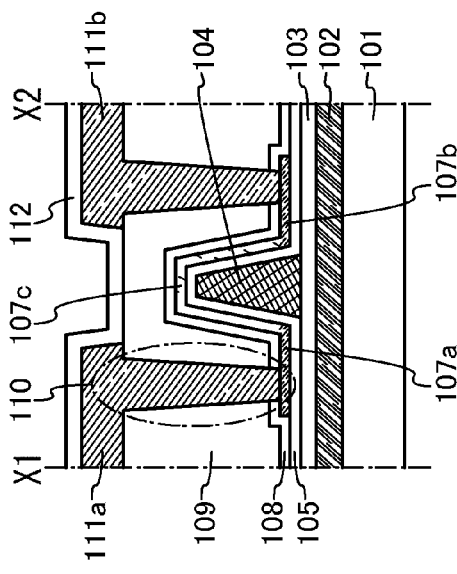
FIG. 1B2
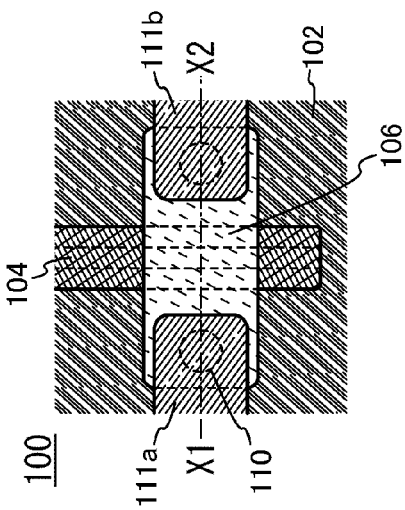
FIG. 1A1
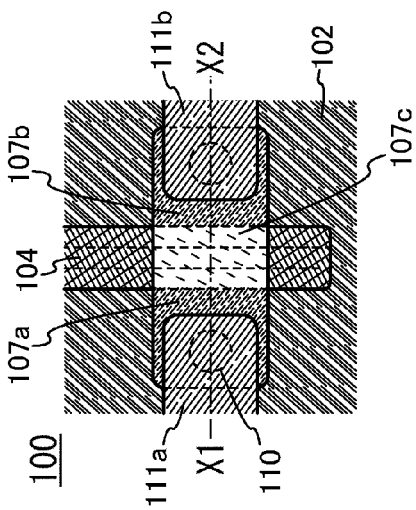
FIG. 1A2

SEMICONDUCTOR DEVICE

BACKGROUND OF THE INVENTION

1. Field of the Invention

The present invention relates to semiconductor devices and methods for manufacturing the semiconductor devices. The present invention especially relates to a technique for miniaturizing semiconductor integrated circuits.

In this specification, a "semiconductor device" refers to a device which can function by utilizing semiconductor characteristics; a semiconductor element, an electro-optical device, a memory device, a semiconductor circuit, and an electronic apparatus are all included in the category of the semiconductor device.

2. Description of the Related Art

A transistor is widely known as one of semiconductor elements and often used for memory devices such as SRAM and DRAM, and display devices including a liquid crystal element, an EL element, or the like. A reduction in area per transistor is needed for higher integration and higher definition of such semiconductor devices. However, in a transistor with a small area, particularly in a transistor having a channel length of 100 nm or shorter, a punch-through phenomenon in which electrical continuity between a source and a drain is established due to a short-channel effect is likely to occur, so that the transistor becomes incapable of functioning as a switching element, which has been considered as a problem.

Against such a problem, a method for forming a three-dimensional transistor in which the area occupied by one transistor is reduced and the effective channel length is maintained so as not to cause a short-channel effect has been proposed.

For example, Patent Document 1 discloses an inversed staggered transistor in which a channel is formed over a portion between two gate electrodes so that the channel length is increased by steps of the gate electrodes.

Patent Document 2 discloses an inversed staggered transistor having a structure, in addition to the structure disclosed in Patent Document 1, in which the thickness of each gate electrode is set to larger than the width thereof so that a channel length is relatively increased by an increase in thickness of the gate electrodes.

Patent Document 3 discloses an inversed staggered transistor in which a gate electrode with a depressed portion is formed and a channel is formed over the depressed portion so that the channel length is increased by steps of the gate electrode.

Patent Document 4 discloses an inversed staggered transistor having a structure, in addition to the structure disclosed in Patent Document 3, in which the thickness of the gate electrode with a depressed portion is set to larger than the distance between steps of the gate electrode so that a channel length is relatively increased by an increase in thickness of the gate electrode. According to the above, even when the area occupied by one transistor is reduced and the planar size of the transistor is reduced, a channel length which hardly generates a punch-through phenomenon due to a short-channel effect can be obtained.

REFERENCE

Patent Document

[Patent Document 1] Japanese Published Patent Application No. H5-110095
[Patent Document 2] Japanese Published Patent Application No. H5-110096
[Patent Document 3] Japanese Published Patent Application No. H5-110097
[Patent Document 4] Japanese Published Patent Application No. H5-110098

SUMMARY OF THE INVENTION

In the above structures, a plurality of gate electrodes is needed for each transistor. Alternatively, a depressed portion needs to be formed in the gate electrode to form the gate electrode with a depressed portion. Further, a source region and a drain region are formed by an ion implantation method using a resist mask, and therefore a margin of an alignment error in a photolithography process for forming the resist mask needs to be considered; consequently, there is a problem in that miniaturization of a transistor is difficult.

In view of the above, an object of one embodiment of the present invention is to provide a semiconductor device which is easily miniaturized.

An object of one embodiment of the present invention is to provide a semiconductor device in which a short-channel effect hardly occurs even when the semiconductor device is miniaturized.

An object of one embodiment of the present invention is to provide a semiconductor device with high productivity.

An object of one embodiment of the present invention is to provide a highly reliable semiconductor device.

An object of one embodiment of the present invention is to provide a semiconductor device with low power consumption.

Each embodiment of the invention disclosed in this specification achieves at least one of the above objects.

A gate electrode of a transistor is formed so that the height is greater than or equal to the length of the lower base in the cross section in the channel length direction of the transistor. A semiconductor layer is formed over the gate electrode with a gate insulating layer provided therebetween. A channel is formed in a region in the semiconductor layer, which faces the gate electrode with the gate insulating layer provided therebetween. With such a structure, the effective channel length can be twice or more the channel length seen from the above of the transistor, thereby achieving a highly reliable semiconductor device in which a short-channel effect hardly occurs even when the semiconductor device is miniaturized.

An electrode (hereinafter also referred to as lower electrode) is provided under the gate electrode with an insulating layer provided therebetween so that the electrode overlaps with the semiconductor layer. A potential (electric field) of the lower electrode imparts a conductivity type to the semiconductor layer overlapping with the lower electrode, so that a source region and a drain region are formed in the semiconductor layer. The gate electrode serves as a shield, so that a region in the semiconductor layer, which faces the gate electrode with the gate insulating layer provided therebetween, is not influenced by the electric field from the lower electrode.

In other words, a channel formation region, the source region, and the drain region can be formed in a self-aligned manner without an impurity introduction step. Since the impurity introduction step is involved, the productivity of the semiconductor device can be increased. Further, the transistor can be easily miniaturized.

Adjustment of the potential of the lower electrode can change the resistance value of the source and drain regions.

One embodiment of the present invention is a semiconductor device including a lower electrode over a substrate; a gate electrode over the lower electrode with an insulating layer provided therebetween; a gate insulating layer over the gate electrode; and a semiconductor layer over the gate insulating layer, in which the semiconductor layer includes a first region and a second region which face the lower electrode and a third region which faces the gate electrode, and in which in the cross section in the channel length direction, a height of the gate electrode is greater than or equal to a length of a lower base of the gate electrode.

In the semiconductor layer, one of the first and second regions functions as a source region and the other functions as a drain region. A channel is formed in the third region in the semiconductor layer.

In the cross section in the channel length direction, the value obtained by dividing the height of the gate electrode by the length of the lower base of the gate electrode (aspect ratio) is preferably greater than or equal to 1, and further preferably greater than or equal to 2. As the aspect ratio of the gate electrode is larger, a short-channel effect is likely to be suppressed, leading to a highly reliable semiconductor device.

The lower electrode may be formed to be separated into at least a first electrode and a second electrode, and a first potential may be supplied to the first electrode overlapping with the first region in the semiconductor layer and a second potential may be supplied to the second electrode overlapping with the second region in the semiconductor layer; thus, the resistance values of the first and second regions can be different from each other. In other words, the resistance values of the source and drain regions can be different from each other.

Another embodiment of the present invention is a semiconductor device including a first electrode and a second electrode over a substrate; a gate electrode over the first electrode and the second electrode with an insulating layer provided therebetween; and a semiconductor layer over the gate electrode with a gate insulating layer provided therebetween, in which the semiconductor layer includes a first region overlapping with the first electrode, a second region overlapping with the second electrode, and a third region facing the gate electrode, and in which in the cross section in the channel length direction, a height of the gate electrode is greater than or equal to a length of a lower base of the gate electrode.

Note that the first electrode and the second electrode do not necessarily overlap with the gate electrode.

Potentials whose polarities are different from each other may be supplied to the first electrode and the second electrode to impart different conductivity types to the first and second regions. Therefore, one semiconductor element can be used as a transistor, a diode, and a photoelectric conversion element, for example. In addition, the conductivity type of one transistor can be switched as needed between a p type and an n type.

In one embodiment of the present invention, a semiconductor device which is easily miniaturized can be provided.

In one embodiment of the present invention, a semiconductor device in which a short-channel effect hardly occurs even when the semiconductor device is miniaturized can be provided.

In one embodiment of the present invention, a semiconductor device with high productivity can be provided.

In one embodiment of the present invention, a highly reliable semiconductor device can be provided.

In one embodiment of the present invention, a semiconductor device with low power consumption can be provided.

BRIEF DESCRIPTION OF THE DRAWINGS

In the accompanying drawings:

FIGS. 1A1, 1A2, 1B1, and 1B2 illustrate structures of semiconductor devices;

DETAILED DESCRIPTION OF THE INVENTION

Figure 2A:
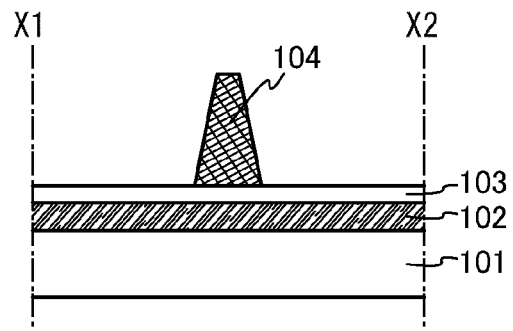
FIGS. 2A to 2D illustrate a process for manufacturing a semiconductor device.

Embodiments of the disclosed invention will be described below with reference to the drawings. Note that the invention disclosed below can be implemented in a wide variety of modes, and it will be apparent to those skilled in the art that modes and details can be modified without departing from the spirit and scope of the disclosed invention. Therefore, the present invention is not construed as being limited to description of the embodiments. Note that, in the drawings hereinafter shown, the same portions or portions having similar functions are denoted by the same reference numerals, and repeated description thereof will be omitted.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

A transistor is a kind of semiconductor elements and can achieve amplification of a current or a voltage, switching operation for controlling conduction or non-conduction, or the like. A transistor in this specification includes an insulated-gate field effect transistor (IGFET) and a thin film transistor (TFT).

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., ground potential) is merely called potential or voltage, and a potential and a voltage are used as synonymous words in many cases. Thus, in this specification, a potential may be rephrased as a voltage and a voltage may be rephrased as a potential unless otherwise specified.

In addition, in this specification and the like, ordinal numbers such as "first", "second", and "third" are used in order to avoid confusion among components, and the terms do not limit the components numerically.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, the term "over" or "below" does not necessarily mean that a component is placed "directly on" or "directly under" another component.

(Embodiment 1)

This embodiment describes a structure of a transistor and a method for manufacturing the transistor, each of which is one embodiment of the present invention, with reference to FIGS. 1A1, 1A2, 1B1, and 1B2, FIGS. 2A to 2D, and FIGS. 3A to 3C.

FIG. 1A1 is a top view of a transistor 100. FIG. 1B1 is a cross-sectional view taken along X1-X2 in FIG. 1A1. FIG. 1A2 is a top view of the transistor 100. FIG. 1B2 is a cross-sectional view taken along X1-X2 in FIG. 1A2. Note that FIGS. 1B1 and 1B2 are cross-sectional views of the transistor 100 in the channel length direction.

In the transistor 100, an electrode 102 is formed over a substrate 101. An insulating layer 103 is formed over the electrode 102, and a gate electrode 104 is formed over the insulating layer 103. The gate electrode 104 has a height (thickness) larger than the length of the lower base in the cross section in the channel direction.

A gate insulating layer 105 is formed over the gate electrode 104. A semiconductor layer 106 with an island shape is formed over the gate insulating layer 105. An insulating layer 108 is formed over the island-shaped semiconductor layer 106. An insulating layer 109 is formed over the insulating layer 108. A source electrode 111a and a drain electrode 111b are formed over the insulating layer 109, and electrically connected to the island-shaped semiconductor layer 106 through a contact hole 110 formed in the insulating layer 108 and the insulating layer 109. An insulating layer 112 is formed over the source and drain electrodes 111a and 111b. Note that the contact hole 110 is formed over each of a source region 107a and a drain region 107b which are formed in the semiconductor layer 106.

An electric field is applied to the island-shaped semiconductor layer 106 overlapping with the electrode 102 by supply of a potential to the electrode 102, thereby generating carriers in the island-shaped semiconductor layer 106. FIGS. 1A2 and 1B2 illustrate a state in which the source and drain regions 107a and 107b are formed in regions in the island-shaped semiconductor layer 106 which overlap with the electrode 102 by the supply of a potential for generating carriers in the island-shaped semiconductor layer 106 to the electrode 102. Note that in a region in the island-shaped semiconductor layer 106, which faces the gate electrode 104 with the gate insulating layer 105 provided therebetween, carriers are not generated because the electric field occurring from the electrode 102 is blocked by the gate electrode 104. Thus, the region in the island-shaped semiconductor layer 106, which faces the gate electrode 104 with the gate insulating layer 105 provided therebetween, becomes a channel formation region 107c.

For example, when the island-shaped semiconductor layer 106 is formed with use of an intrinsic (i-type) semiconductor or a substantially intrinsic semiconductor and a positive potential is supplied to the electrode 102, the source and drain regions 107a and 107b become n-type and the channel formation region 107c remains i-type or substantially i-type. The carrier concentration of the source and drain regions 107a and 107b can be changed by adjustment of a level of the potential supplied to the electrode 102. Therefore, the resistance values of the source and drain regions 107a and 107b can be controlled by adjustment of a level of the potential supplied to the electrode 102.

Note that an intrinsic semiconductor is ideally a semiconductor which does not include impurities and whose Fermi level lies substantially in the middle of the forbidden band, but in this specification, a semiconductor to which an impurity serving as a donor or an impurity serving as an acceptor is added and whose Fermi level lies substantially in the middle of the forbidden band is also included in the category of the intrinsic semiconductor.

The gate electrode 104 serves as a shield, so that the region in the island-shaped semiconductor layer 106, which faces the gate electrode 104 with the gate insulating layer 105 provided therebetween is not influenced by the potential (electric field) of the electrode 102. Therefore, the channel formation region 107c is formed in a self-aligned manner. Further, the source and drain regions 107a and 107b can be formed without an impurity introduction step such as an ion implantation method, which enables miniaturization and improvement in productivity of a semiconductor device.

The gate electrode 104 is formed so that the height is larger than the length of the lower base in the cross section in the channel length direction, and the island-shaped semiconductor layer 106 is formed to cover the gate electrode 104. With such a structure, the area occupied by the transistor can be reduced and the channel length of the transistor can be a length which hardly causes a short-channel effect. Specifically, the island-shaped semiconductor layer 106 may be formed to cover the gate electrode 104 having a length of the lower base of 50 nm and a height of 50 nm, resulting in that the effective channel length is 100 nm or longer despite the channel length seen from the above is 50 nm. In other words, the effective channel length can be twice or more the channel length seen from the above (the length of the lower base of the gate electrode 104 in the cross section in the channel length direction). The value obtained by dividing the height of the gate electrode 104 by the length of the lower base of the gate electrode 104 (aspect ratio) is preferably greater than or equal to 1, and further preferably greater than or equal to 2.

An example of a method for manufacturing the transistor 100 disclosed in this embodiment will be described with reference to FIGS. 2A to 2D.

First, the electrode 102 is formed over the substrate 101. There is no particular limitation on a substrate used as the substrate 101. For example, a plastic substrate having heat resistance to withstand the treatment temperature in the manufacturing process can be used as well as a glass substrate, a ceramic substrate, a single crystal semiconductor substrate made of silicon, silicon carbide, or the like, a polycrystalline semiconductor substrate, a compound semiconductor substrate made of silicon germanium or the like, and an SOI substrate. Alternatively, a metal substrate made of a stainless steel alloy or the like can be used as the substrate 101. In the case of using a conductive substrate as the substrate 101, the substrate 101 serves as the electrode 102; thus, formation of the electrode 102 can be skipped.

As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further alternatively, a flexible substrate may be used as the substrate 101. In the case where a flexible substrate is used, a transistor may be directly formed over a flexible substrate. Alternatively, a transistor may be formed over a manufacturing substrate, and then, the transistor may be separated from the manufacturing substrate and transferred to a flexible substrate. Note that in order to separate the transistor from the manufacturing substrate and transfer it to the flexible substrate, a separation layer may be provided between the manufacturing substrate and the transistor.

A base layer may be provided between the substrate 101 and the electrode 102. The base layer can be formed using a signal layer or a stacked layer using one or more of materials selected from aluminum nitride, aluminum oxide, aluminum nitride oxide, aluminum oxynitride, silicon nitride, silicon oxide, silicon nitride oxide, and silicon oxynitride. The base layer has a function of preventing diffusion of an impurity element from the substrate 101. Note that in this specification, nitride oxide is a substance which includes more nitrogen than oxygen, and an oxynitride is a substance which includes more oxygen than nitrogen. Note that content of each element can be measured by Rutherford backscattering spectrometry (RBS) or the like, for example. The base layer can be formed by a sputtering method, a CVD method, a coating method, a printing method, or the like as appropriate.

When a halogen element such as chlorine or fluorine is contained in the base layer, a function of preventing diffusion of an impurity element from the substrate 101 can be further improved. The concentration of a halogen element contained in the base layer is measured by secondary ion mass spectrometry (SIMS) and its peak is preferably greater than or equal to $1\times10^{15}/cm^3$ and less than or equal to $1\times10^{20}/cm^3$.

Next, a conductive layer to be the electrode 102 is formed by a sputtering method, a vacuum evaporation method, or a plating method. The conductive layer may be selectively etched as necessary. In the case of etching the conductive layer selectively, a resist mask is formed over the conductive layer, and an unnecessary portion in the conductive layer may be removed by a dry etching method or a wet etching method. The resist mask formed over the conductive film can be formed by a printing method, an inkjet method, a photolithography method, or the like as appropriate. Formation of the resist mask by an inkjet method needs no photomask; thus, manufacturing cost can be reduced.

Note that unless otherwise specified, a photolithography process in this specification includes a step of forming a resist mask, a step of etching a conductive layer or an insulating layer, and a step of separating the resist mask.

As a material used for forming the conductive layer to be the electrode 102, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, a material containing one or more metal elements selected from manganese (Mn), magnesium (Mg), zirconium (Zr), and beryllium (Be) may be used.

The conductive layer to be the electrode 102 may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, and a three-layer structure in which titanium, aluminum, and titanium are stacked in this order are given.

For the conductive layer to be the electrode 102, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked structure of the above light-transmitting conductive material and a material containing the above metal element may be employed.

Next, the insulating layer 103 is formed over the electrode 102. The insulating layer 103 can be formed using a signal layer or a stacked layer using one or more of materials selected from aluminum nitride, aluminum oxide, aluminum nitride oxide, aluminum oxynitride, silicon nitride, silicon oxide, silicon nitride oxide, and silicon oxynitride.

When a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the insulating layer 103, while the substantial (e.g., silicon oxide equivalent) thickness of the insulating layer is not changed, the physical thickness of the insulating layer can be increased; therefore, leakage current between the gate electrode 104 to be formed later and the electrode 102 can be reduced. Further, a stacked structure can be used in which a high-k material and one or more of silicon oxide, silicon oxynitride, silicon nitride, silicon nitride oxide, aluminum oxide, aluminum oxynitride, and gallium oxide are stacked. The thickness of the insulating layer 103 may be greater than or equal to 10 nm and less than or equal to 300 nm, preferably greater than or equal to 50 nm and less than or equal to 200 nm.

The insulating layer 103 is formed by a sputtering method or a CVD method, for example. The insulating layer 103 can be formed by a deposition method such as a high-density plasma CVD method using microwaves (e.g., a frequency of 2.45 GHz) as well as a sputtering method and a CVD method.

Oxygen (including at least any one of oxygen radicals, oxygen atoms, and oxygen ions) may be introduced into the insulating layer 103 so that the insulating layer 103 is in an oxygen excess state. For the introduction of oxygen, an ion implantation method, an ion doping method, a plasma immersion ion implantation method, plasma treatment performed under an atmosphere containing oxygen, or the like can be employed. In the case of performing plasma treatment under an atmosphere containing oxygen, an ashing apparatus can be used, for example.

In this embodiment, a 100-nm-thick silicon oxide layer is formed over the electrode 102 by a sputtering method, as the insulating layer 103.

Next, a conductive layer is formed over the insulating layer 103 and selectively etched through a photolithography process to form the gate electrode 104 (including a wiring formed of the conductive layer). Note that a resist mask may be formed by an inkjet method. Formation of the resist mask by an inkjet method needs no photomask; thus, manufacturing cost can be reduced. In the case where a miniaturized transistor whose channel length (L) is shorter is manufactured, light with a short wavelength less than or equal to i-line (365 nm) is preferably used as a light source in photolithography in order to improve resolution of the pattern.

As a material used for forming the conductive layer to be the gate electrode 104, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, a material containing one or more metal elements selected from manganese (Mn), magnesium (Mg), zirconium (Zr), and beryllium (Be) may be used.

The conductive layer to be the gate electrode 104 may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg— Al alloy, and a three-layer structure in which titanium, aluminum, and titanium are stacked in this order are given.

For the conductive layer to be the gate electrode 104, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked structure of the above light-transmitting conductive material and a material containing the above metal element may be employed.

For the conductive layer to be the gate electrode 104, indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (e.g., InN, ZnN) may be used.

These materials each have a work function of 5 eV or higher. The gate electrode 104 is formed so as to face the semiconductor layer 106 to be formed later with the gate insulating layer 105 provided therebetween, whereby the threshold voltage, which is one of electric characteristics of the transistor, can be positive. Accordingly, a so-called normally-off n-type transistor can be achieved.

Note that in the case of using, for example, indium gallium zinc oxide containing nitrogen for the semiconductor layer 106, indium gallium zinc oxide having a higher nitrogen concentration at least than the semiconductor layer 106, specifically, indium gallium zinc oxide having a nitrogen concentration of 7 atomic % or higher may be used.

The gate electrode 104 may have a stacked structure obtained by combining the materials having a work function of 5 eV or higher, the conductive materials having a light transmitting property, and the materials containing a metal element as appropriate.

The etching of the conductive layer to be the gate electrode 104 may be performed by either a dry etching method or a wet etching method, or both. As an etching gas for dry etching, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be used. Further, an inert gas may be added to an etching gas. For dry etching, parallel plate reactive ion etching (RIE) or inductively coupled plasma (ICP) etching can be used.

In this embodiment, as the conductive layer to be the gate electrode 104, a 100-nm-thick tungsten layer is formed and subjected to a photolithography process to have an aspect ratio of 2 (the length of the lower base in the cross section in the channel length direction is 50 nm) (see FIG. 2A).

Note that the shape of the side surface of the gate electrode 104 is preferably a forward tapered shape. In the forward tapered shape, a layer increases in thickness toward the bottom and is in contact with a layer serving as a base when seen in the cross section. A taper angle is an inclination angle formed by a side surface and a bottom surface of a layer having a tapered shape (e.g., the gate electrode 104) when being observed in the direction perpendicular to the cross section (a plane which is perpendicular to the surface of the substrate). A taper angle smaller than 90° is called forward taper angle and a taper angle of 90° or larger is called inverse tapered angle. By making the angle of an end of a layer to be a forward tapered angle, a phenomenon in that a layer formed over the end of the layer is separated (disconnection) can be prevented; thus, the coverage with the layer can be improved.

Subsequently, the gate insulating layer 105 is formed over the gate electrode 104. The gate insulating layer 105 can be formed with use of the material used for the insulating layer 103 by the method applied to formation of the insulating layer 103. The thickness of the gate insulating layer 105 is preferably greater than or equal to 1 nm and less than or equal to 300 nm, and further preferably greater than or equal to 1 nm and less than or equal to 100 nm. In the case of using an oxide semiconductor for the semiconductor layer 106 to be formed later, a material from which oxygen is released by heating is preferably used for the gate insulating layer 105. "Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Oxygen (including at least one of oxygen radicals, oxygen atoms, and oxygen ions) may be introduced into the gate insulating layer 105 so that the gate insulating layer 105 is in an oxygen excess state. For the introduction of oxygen, an ion implantation method, an ion doping method, a plasma immersion ion implantation method, plasma treatment performed under an atmosphere containing oxygen, or the like can be employed. In the case of performing plasma treatment under an atmosphere containing oxygen, an ashing apparatus can be used, for example.

In this embodiment, a 50-nm-thick silicon oxide layer is formed over the gate electrode 104, as the gate insulating layer 105.

Next, a semiconductor film is formed over the gate insulating layer 105, and subjected to a photolithography process to form the island-shaped semiconductor layer 106. For example, a polycrystalline semiconductor, a microcrystalline semiconductor, or an amorphous semiconductor can be used for the semiconductor film to be the island-shaped semiconductor layer 106. Examples of a material for the semiconductor film include silicon, germanium, silicon germanium, silicon carbide, and gallium arsenide. The semiconductor film can be formed by a sputtering method or a CVD method.

Alternatively, an oxide semiconductor can be used for the semiconductor film to be the island-shaped semiconductor layer 106. An oxide semiconductor has a wide energy gap of 3.0 eV or higher. In a transistor including an oxide semiconductor processed in appropriate conditions, the off-state current at an operating temperature (e.g., 25° C.) can be 100 zA ($1 \times 10^{-19}$ A) or lower, 10 zA ($1 \times 10^{-20}$ A) or lower, or 1 zA ($1 \times 10^{-21}$ A) or lower. Thus, a semiconductor device with low power consumption can be achieved.

The oxide semiconductor film can be formed by a sputtering method. In the case of using an oxide semiconductor for the semiconductor film, in order that hydrogen, a hydroxyl group, and moisture are contained as little as possible in the oxide semiconductor film, as pretreatment for the formation of the oxide semiconductor film, the substrate 101 over which the gate electrode 104 and the gate insulating layer 105 are formed is preferably preheated in a preheating chamber of a sputtering apparatus, whereby impurities such as hydrogen or moisture adsorbed on the substrate 101 are eliminated and removed. Note that as an evacuation unit provided in the preheating chamber, a cryopump is preferable. This preheating can be skipped. Further, this preheating may be similarly performed on the substrate 101 over which layers up to and including the gate electrode 104 are formed, before the formation of the gate insulating layer 105.

Although an amorphous oxide semiconductor can be used as the oxide semiconductor, a crystalline oxide semiconductor is preferably used. With use of the crystalline oxide semiconductor for the semiconductor layer 106, it is possible to provide a highly reliable semiconductor device in which changes of the electric characteristics of the transistor due to irradiation with visible light or ultraviolet light are suppressed. Furthermore, the crystalline oxide semiconductor has neither a single crystal structure nor an amorphous structure and is a crystalline oxide semiconductor having c-axis alignment (also referred to as c-axis aligned crystalline oxide semiconductor (CAAC-OS)).

Figure 3A:
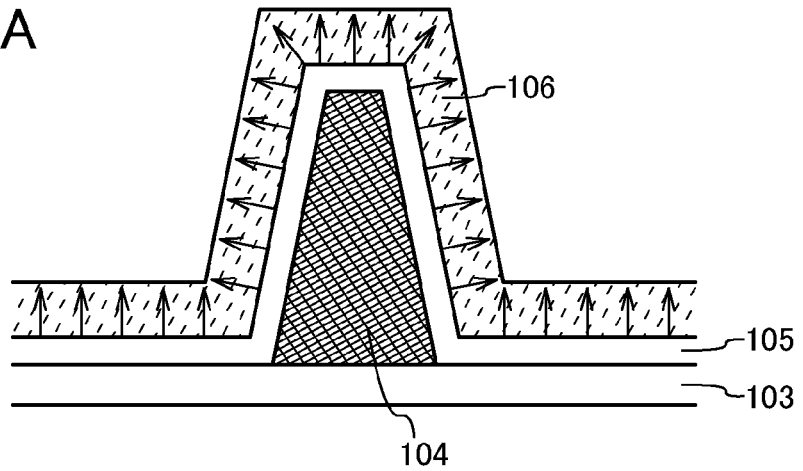
FIGS. 3A to 3C illustrate examples of methods for manufacturing a semiconductor layer.
Figure 3B:
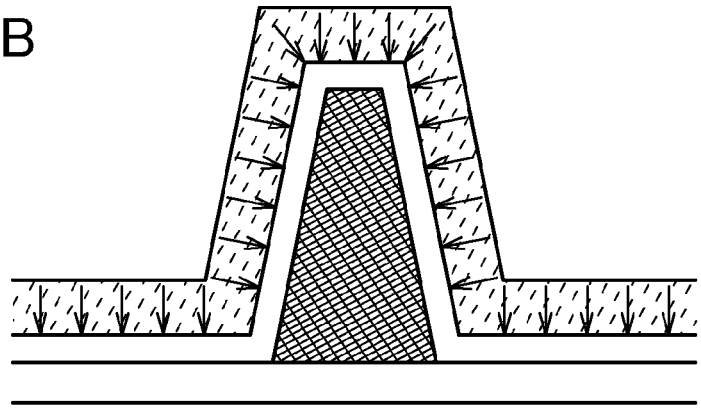
Figure 3C:
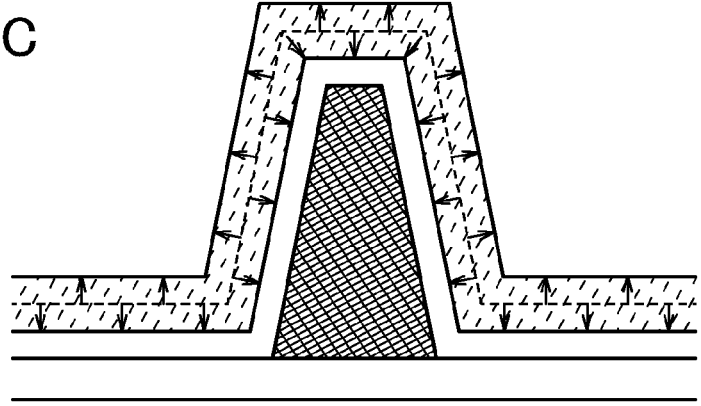

Here, FIGS. 3A to 3C illustrate three examples of methods for obtaining a crystalline oxide semiconductor having c-axis alignment. The first method is to form an oxide semiconductor layer at a film formation temperature of 400° C. to 450° C., thereby obtaining c-axis alignment in the directions of arrows in FIG. 3A. The second method is to form a thin film and then subject the film to heat treatment performed at 200° C. to 700° C., thereby obtaining c-axis alignment in the directions of arrows in FIG. 3B. The third method is to form a first thin film, subject the film to heat treatment performed at 200° C. to 700° C., and then form a second film, thereby obtaining c-axis alignment in the directions of arrows in FIG. 3C.

As illustrated in FIGS. 3A to 3C, through any of the methods, crystal growth occurs in the direction perpendicular to an uneven surface of the oxide semiconductor layer 144, and a crystalline oxide semiconductor having c-axis alignment can be obtained.

For the oxide semiconductor, a metal oxide semiconductor containing zinc can be used. For example, four-component metal oxide such as an In—Sn—Ga—Zn-based oxide semiconductor, three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor, or single-component metal oxide such as an In-based oxide semiconductor, a Sn-based oxide semiconductor, or a Zn-based oxide semiconductor can be used. Further, $SiO_2$ may be contained in the above oxide semiconductor. The oxide semiconductor contains at least one element selected from In, Ga, Sn, and Zn.

Here, for example, an In—Ga—Zn-based oxide semiconductor means an oxide semiconductor containing indium (In), gallium (Ga), and zinc (Zn), and there is no limitation on the composition ratio thereof. The In—Ga—Zn-based oxide semiconductor may contain an element other than In, Ga, and Zn. In this case, the oxide semiconductor preferably contains a larger amount of oxygen than the stoichiometric proportion. When the amount of oxygen is in excess of stoichiometric proportion, generation of carriers which results from oxygen vacancy in the oxide semiconductor can be suppressed.

For the oxide semiconductor, a thin film expressed by a chemical formula of $InMO_3(ZnO)_m$ (m>0) can be used. Here, M represents one or more of metal elements selected from Zn, Ga, Al, Mn, and Co. For example, M can be Ga, Ga and Al, Ga and Mn, or Ga and Co.

In the case where an In—Zn-based oxide semiconductor is used as the oxide semiconductor, the atomic ratio is set so that In/Zn ranges from 0.5 to 50, preferably from 1 to 20, further preferably from 1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

In this embodiment, a 30-nm-thick film is formed by sputtering using an In—Ga—Zn-based oxide target, as a semiconductor film. The oxide semiconductor film can be formed by sputtering in a rare gas (typically argon) atmosphere, an oxygen atmosphere, or a mixed atmosphere of a rare gas and oxygen.

Here, a sputtering apparatus used for forming the oxide semiconductor film will be described below in detail.

The leakage rate of a deposition chamber in which the oxide semiconductor is formed is preferably lower than or equal to $1 \times 10^{-10}$ Pa·m$^3$/s; thus, entry of impurities into the film can be suppressed during the deposition by sputtering.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/s.

In order to decrease external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring and can reduce the external leakage. Further, by using a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the deposition chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the member of the deposition apparatus may be covered with iron fluoride, aluminum oxide, chromium oxide, or the like which is in the passive state.

Further, it is preferable to provide a gas refiner for a sputtering gas just in front of the deposition chamber. In this case, the length of a pipe between the gas purifier and the deposition chamber is less than or equal to 5 m, preferably less than or equal to 1 m. When the length of the pipe is less than or equal to 5 m or less than or equal to 1 m, the effect of the released gas from the pipe can be reduced accordingly.

The deposition chamber is preferably evacuated with a rough vacuum pump such as a dry pump, and a high vacuum pump such as a sputter ion pump, a turbo molecular pump, or a cryopump in appropriate combination. In order to remove moisture remaining in the deposition chamber, an entrapment vacuum pump, such as a cryopump, an ion pump, or a titanium sublimation pump, is preferably used. The turbo molecular pump has an outstanding capability in evacuating a large-sized molecule, whereas it has a low capability in evacuating hydrogen or water. Hence, a combination of a cryopump having a high capability in evacuating water and a sputter ion pump having a high capability in evacuating hydrogen is effective. Further, an evacuation unit may be a turbo molecular pump provided with a cold trap. In the deposition chamber which is evacuated with an entrapment vacuum pump such as a cryopump, a hydrogen atom, a compound containing a hydrogen atom, such as water ($H_2O$), (more preferably, also a compound containing a carbon atom), and the like are removed, whereby the concentration of impurities contained in the oxide semiconductor layer formed in the deposition chamber can be reduced.

An adsorbate inside the deposition chamber does not affect the pressure in the deposition chamber because it is adsorbed on the inner wall, but leads to release of gas at the time of the evacuation of the deposition chamber. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promoting desorption of the adsorbate. By the baking, the rate of removal of the adsorbate can be increased about tenfold. The baking may be performed at a temperature higher than or equal to 100° C. and lower than or equal to 450° C. At this time, when the adsorbate is removed while an inert gas is added, the rate of removal of water or the like, which is difficult to desorb simply by evacuation, can be further increased.

For sputtering, an RF power supply device, an AC power supply device, a DC power supply device, or the like can be used as appropriate as a power supply device for generating plasma.

As a target for forming the oxide semiconductor by sputtering, a target that contains metal oxide containing In, Ga, and Zn at a composition ratio of $In_2O_3:Ga_2O_3:ZnO=1:1:1$ [molar ratio] can be used, for example. Alternatively, it is possible to use a target with a composition ratio of $In_2O_3:Ga_2O_3:ZnO=1:1:2$ [molar ratio], a target with a composition ratio of $In_2O_3:Ga_2O_3:ZnO=1:1:4$ [molar ratio], or a target with a composition ratio of $In_2O_3:Ga_2O_3:ZnO=2:1:8$ [molar ratio].

The relative density of the metal oxide target is higher than or equal to 90% and lower than or equal to 100%, preferably higher than or equal 95% and lower than or equal to 99.9%. With the use of metal oxide target with a high relative density, a dense oxide semiconductor layer can be deposited.

As a sputtering gas, a rare gas (typically argon) atmosphere, an oxygen gas atmosphere, or a mixed gas of a rare gas and oxygen is used as appropriate. It is preferable that a high-purity gas from which impurities such as hydrogen, water, a hydroxyl group, and hydride are removed be used as a sputtering gas. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

When the oxide semiconductor is deposited, the substrate is held in a deposition chamber kept under a reduced pressure and the substrate temperature is set at a temperature higher than or equal to 100° C. and lower than or equal to 600° C., preferably higher than or equal to 300° C. and lower than or equal to 500° C.

By heating the substrate during deposition, the concentration of impurities, such as hydrogen, moisture, hydride, or hydroxide, contained in the deposited oxide semiconductor can be reduced. In addition, damage by sputtering is reduced. Then, a sputtering gas from which hydrogen and moisture are removed is introduced into the deposition chamber while moisture remaining therein is removed, and the oxide semiconductor film is formed with the use of the above target.

The concentration of an alkali metal such as Na or Li in the oxide semiconductor is preferably $1 \times 10^{18}$ atoms/cm$^3$ or lower, further preferably $2 \times 10^{16}$ atoms/cm$^3$ or lower.

An example of the film formation conditions is as follows: the distance between the substrate and the target is 100 mm, the pressure is 0.6 Pa, the electric power of the DC power source is 0.5 kW, and oxygen (the flow rate ratio of oxygen is 100%) is used as a sputtering gas. Note that a pulsed direct-current power source is preferably used, in which case powder substances (also referred to as particles or dust) generated during the deposition can be reduced and the film thickness can be uniform.

Note that the oxide semiconductor film sometimes contains a considerable amount of nitrogen even if it is formed by using the above-described sputtering apparatus. For example, in some cases, the concentration of nitrogen in the oxide semiconductor film, measured by secondary ion mass spectrometry (SIMS), is less than $5 \times 10^{18}$ atoms/cm$^3$.

It is preferable that the gate insulating layer 105 and the oxide semiconductor film serving as the island-shaped semiconductor layer 106 be successively formed without being exposed to the air. By forming the gate insulating layer 105 and the oxide semiconductor film successively without exposure to the air, impurities such as water, hydrogen, or hydrocarbon can be prevented from being attached to the interface between the gate insulating layer 105 and the oxide semiconductor film.

Next, first heat treatment is performed. With the first heat treatment, excessive hydrogen (including water and a hydroxyl group) in the oxide semiconductor film is removed (dehydration or dehydrogenation) and the oxide semiconductor film can be purified.

The first heat treatment is performed at a temperature higher than or equal to 250° C. and lower than or equal to 750° C. or at a temperature higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra-dry air (with a moisture content of 20 ppm (equivalent to a dew point of −55° C.) or lower, preferably 1 ppm or lower, further preferably 10 ppb or lower when measured with a dew-point meter using cavity ring-down laser spectroscopy (CRDS)). For example, the substrate is put in an electric furnace which is one of heat treatment apparatuses, and the oxide semiconductor film is subjected to heat treatment at 450° C. for one hour in a nitrogen atmosphere.

Note that a heat treatment apparatus is not limited to an electrical furnace, and may include a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed in the following manner: the substrate is moved into an inert gas heated to a temperature higher than or equal to 650° C. and lower than or equal to 700° C., heated for several minutes, and moved out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, and the like. The purity of nitrogen, oxygen, or the rare gas which is introduced into a heat treatment apparatus is set to 6N (99.9999%) or higher, preferably 7N (99.99999%) or higher (i.e., the impurity concentration is 1 ppm or lower, preferably 0.1 ppm or lower).

Oxygen (including at least any one of oxygen radicals, oxygen atoms, and oxygen ions) may be introduced into the oxide semiconductor film on which dehydration or dehydrogenation has been performed. For the introduction of oxygen, an ion implantation method, an ion doping method, a plasma immersion ion implantation method, plasma treatment performed under an atmosphere containing oxygen, or the like can be employed.

Note that an oxide semiconductor which is purified (purified OS) by reduction of an impurity such as moisture or hydrogen can be made to be an i-type (intrinsic) oxide semiconductor or an oxide semiconductor extremely close to an i-type semiconductor (a substantially i-type oxide semiconductor) by being supplied with oxygen to reduce oxygen deficiency in the oxide semiconductor. A transistor including the i-type or substantially i-type oxide semiconductor in a semiconductor layer where a channel is formed has a characteristic of extremely low off-state current. Specifically, the hydrogen concentration of the oxide semiconductor layer is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Note that the hydrogen concentration in the oxide semiconductor layer is measured by a secondary ion mass spectroscopy method (SIMS).

Figure 2B:
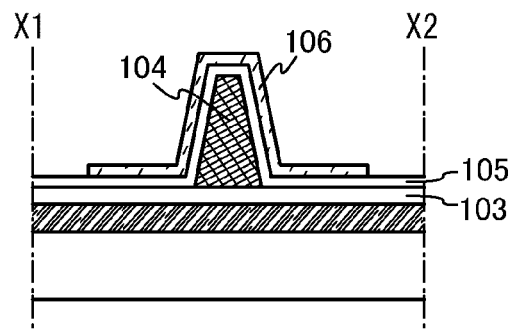
Figure 2C:
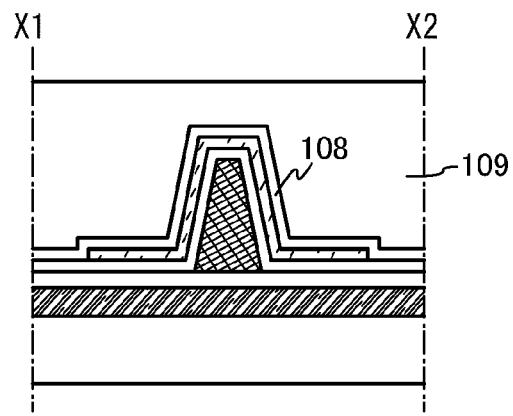

Next, through a photolithography process, the oxide semiconductor film is selectively removed by etching, and the island-shaped semiconductor layer 106 is formed (see FIG. 2B). Note that a resist mask for forming the island-shaped semiconductor layer 106 may be formed by an inkjet method, in which case manufacturing costs can be reduced because a photomask is not used.

Note that the etching of the oxide semiconductor film may be dry etching, wet etching, or both dry etching and wet etching. As an etchant used for wet etching of the oxide semiconductor film, a mixed solution of phosphoric acid, acetic acid, and nitric acid can be used, for example. Alternatively, ITO-07N (produced by Kanto Chemical Co., Inc.) may be used.

Next, the insulating layer 108 is formed over the island-shaped semiconductor layer 106. The insulating layer 108 can be formed with use of the material used for the gate insulating layer 105 and the method applied to formation of the gate insulating layer 105. In the case where an oxide semiconductor is used for the island-shaped semiconductor layer 106, a metal oxide layer containing the same kind of component as the oxide semiconductor may be formed as the insulating layer 108 or stacked over the insulating layer 108.

In this embodiment, a 100-nm-thick silicon oxide layer is formed by a sputtering method, as the insulating layer 108. The substrate temperature in the film formation is higher than or equal to room temperature and lower than or equal to 300° C. and is 100° C. in this embodiment. The silicon oxide layer can be formed by sputtering in a rare gas (typically argon) atmosphere, an oxygen atmosphere, or a mixed atmosphere of a rare gas and oxygen. As a target, a silicon oxide target or a silicon target can be used. For example, a silicon oxide layer can be formed by sputtering under an atmosphere containing oxygen with the use of silicon for the target.

In the case where an oxide semiconductor is used for the island-shaped semiconductor layer 106, after the formation of the insulating layer 108, the second heat treatment (preferably at temperatures from 200° C. to 600° C., for example from 250° C. to 550° C.) may be performed in a reduced pressure atmosphere, an inert gas atmosphere, an oxygen gas atmosphere, or an ultra-dry air. For example, the second heat treatment may be performed at 450° C. in a nitrogen atmosphere for one hour. In the second heat treatment, the oxide semiconductor layer is heated while being in contact with the insulating layer 108. It is preferable that the above atmosphere do not contain water, hydrogen, and the like.

In the case where the island-shaped semiconductor layer 106 is formed with use of an oxide semiconductor, heat treatment performed in a state where the island-shaped semiconductor layer 106 is in contact with the insulating layer 108 containing oxygen enables oxygen to be supplied to the island-shaped semiconductor layer 106 from the insulating layer 108 containing oxygen. The supply of oxygen into the oxide semiconductor makes up for oxygen deficiency in the oxide semiconductor due to dehydration or dehydrogenation, whereby the oxide semiconductor can be made i-type (intrinsic).

Next, the insulating layer 109 is formed over the insulating layer 108. For reduction of the surface roughness, an insulating layer functioning as a planarization insulating layer is preferably used as the insulating layer 109. The insulating layer 109 can be formed using an organic insulating material having heat resistance such as polyimide, an acrylic resin, a benzocyclobutene-based resin, polyamide, or an epoxy resin. As an alternative to such organic insulating materials, it is possible to use a single layer or stacked layers of a low-dielectric constant material (a low-k material), a siloxane-based resin, phosphosilicate glass (PSG), borophosphosilicate glass (BPSG), or the like (see FIG. 2C).

After the formation of the insulating layer 109, CMP treatment may be performed to reduce the roughness on the insulating layer 109. The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Through the CMP process, the root-mean-square (RMS) roughness of a surface of the insulating layer 109 can be less than or equal to 1 nm (preferably, less than or equal to 0.5 nm). The CMP process improves the plarnarity of the surface where an electrode, a wiring, and the like are to be formed, thereby facilitating high integration of a semiconductor device and improving the reliability.

Note that the CMP treatment may be performed only once or plural times. When the CMP treatment is performed plural times, first polishing is preferably performed with a high polishing rate followed by final polishing with a low polishing rate. In this manner, by combining polishing with different polishing rates, the planarity of the surfaces of the insulating layer 109 can be further improved.

Next, part of the insulating layer 108 and the insulating layer 109 is selectively etched through a photolithography process to form the contact hole 110, thereby exposing part of the island-shaped semiconductor layer 106. The etching of the insulating layer 108 and the insulating layer 109 may be performed by either a dry etching method or a wet etching method, or both.

Figure 2D:
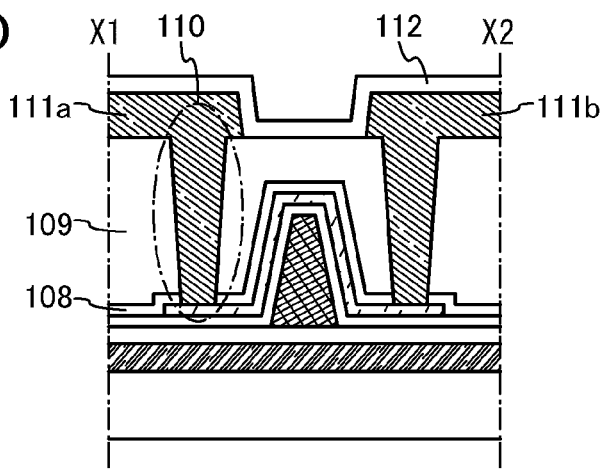

Next, a conductive layer is formed over the insulating layer 103 and selectively etched through a photolithography process to form the source electrode 111a and the drain electrode 111b (including a wiring formed of the conductive layer) (see FIG. 2D). The material and the method used for the formation of the gate electrode 104 can be employed for the formation of the source and drain electrodes 111a and 111b. Through the above steps, the transistor 100 can be formed.

The insulating layer 112 may be formed over the source and drain electrodes 111a and 111b. For example, a silicon nitride layer is formed by a plasma CVD method, a sputtering method, or the like. For the insulating layer 112, an inorganic insulating material that hardly contains impurities such as moisture, a hydrogen ion, or OW and can prevent entry of such impurities from the outside, such as silicon nitride, silicon nitride oxide, aluminum nitride, aluminum oxide, or aluminum oxynitride, is preferably used. In this embodiment, silicon nitride is used for the insulating layer 112 (see FIG. 2D).

After the transistor 100 is formed, heat treatment may be further performed at a temperature higher than or equal to 100° C. and lower than or equal to 200° C. for 1 to 30 hours in the air. This heat treatment may be performed at a fixed heating temperature. Alternatively, it is possible that the following change in temperature is set as one cycle and repeated plural times: the temperature is increased from room temperature to a heating temperature and then decreased to room temperature.

According to this embodiment, a highly reliable semiconductor device in which a short-channel effect hardly occurs even when the area occupied by a transistor is small can be manufactured. Further, power consumption of the semiconductor device can be reduced, and the productivity thereof can be improved.

This embodiment can be implemented by being combined as appropriate with any of the above-described embodiments.
(Embodiment 2)

Figure 4A:
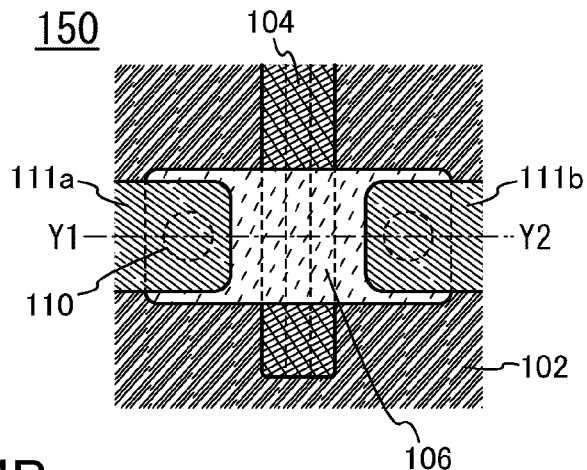
FIGS. 4A to 4C illustrate structures of semiconductor devices.
Figure 4B:
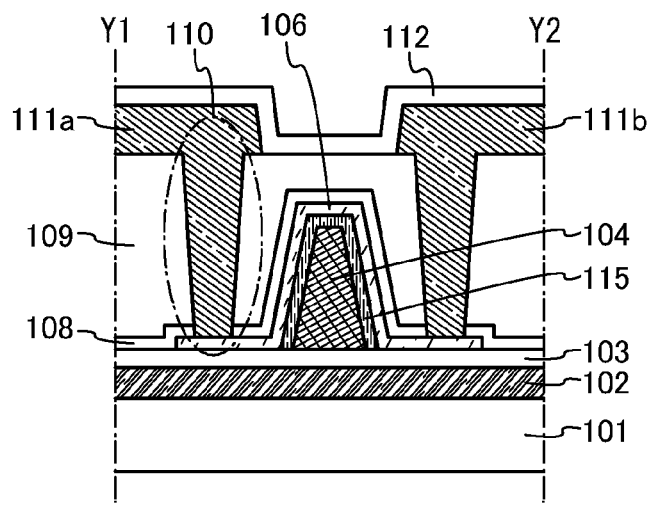
Figure 4C:
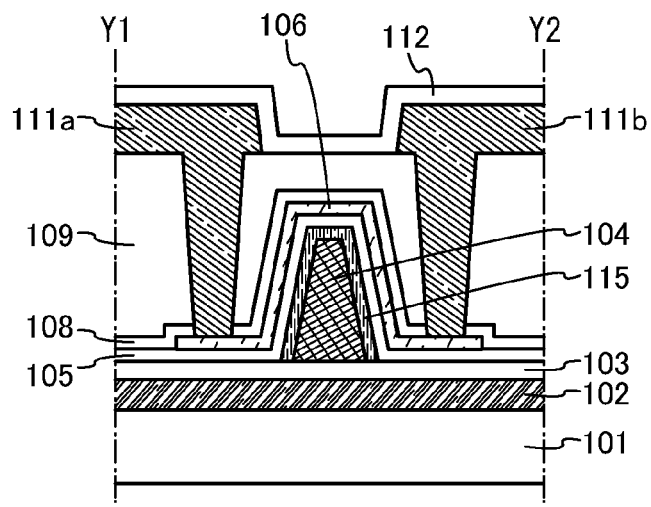

This embodiment describes a transistor 150 which is partly different from the transistor 100 described in Embodiment 1 with reference to FIGS. 4A to 4C.

FIG. 4A is a top view of the transistor 150. FIGS. 4B and 4C are cross-sectional views taken along Y1-Y2 in FIG. 4A. Note that FIGS. 4B and 4C are cross-sectional views of the transistor 150 in the channel length direction.

The transistor 150 described in this embodiment differs from the transistor 100 described in Embodiment 1 in the structure of the gate insulating layer. To miniaturize semiconductor elements, thinning of a gate insulating layer is required in accordance with the scaling law. In thinning of a gate insulating layer, an increase in leakage current and a decrease in withstand voltage due to defects such as pin holes become problems. Considering the above fact, a gate insulating layer of the transistor 150 is formed by an anodic oxidation method.

FIG. 4B illustrates a cross-sectional structure of the transistor 150 in which an oxide layer 115 is formed on the gate electrode 104 by an anodic oxidation method, and the semiconductor layer 106 is formed over the oxide layer 115. The oxide layer 115 functions as a gate insulating layer. The oxide layer 115 is formed with use of a material that can be anodized. The oxide layer 115 can be formed by oxidation of a surface of the gate electrode 104 in an electrolysis solution. Examples of the material that can be anodized include aluminum, tantalum, and titanium. For example, in the case where the gate electrode 104 is formed with use of aluminum and subjected to an anodic oxidation method, aluminum oxide can be formed as the oxide layer 115.

The film quality of the oxide layer 115 can be changed in accordance with the anodic oxidation conditions (for example, the oxide layer 115 can be a dense oxide layer or a porous oxide layer). The oxide layer 115 is used as the gate insulating layer in this embodiment; accordingly, a dense oxide layer is formed on the gate electrode 104.

For example, a solution in which an ethylene glycol solution of tartaric acid of 3% is neutralized with ammonium water so that PH thereof is adjusted to be about 6.8 to 7.2 is used as an electrolysis solution. A dense and firm oxide layer can be formed on the surface of the gate electrode 104 in the following manner: in the electrolysis solution, platinum is used as a cathode and the gate electrode 104 is used as an anode; and current flows between the cathode and the anode under conditions of a formation current of 5 mA/cm$^2$ to 6 mA/cm$^2$ and a formation voltage of 10 V.

The thickness of the anodized film can be controlled by a level of the formation voltage. An anodized film with a thickness of 0.1 nm to 1.5 nm can be formed per formation voltage of 1V. In principle, a pin hole hardly occurs by an anodic oxidation method. Even when a substance is attached to the surface of the gate electrode 104, an electrolysis solution penetrates between the substance and the gate electrode 104 and then the gate electrode 104 is oxidized; thus, an extremely uniform film can be formed on the gate electrode 104.

In the case where the gate electrode 104 is formed with use of tantalum and subjected to an anodic oxidation method, tantalum oxide can be formed as the oxide layer 115. In the case where the gate electrode 104 is formed with use of titanium and subjected to an anodic oxidation method, titanium oxide can be formed as the oxide layer 115. In this manner, the oxide layer 115 contains a constituent element of the gate electrode 104.

As in FIG. 4C, the gate insulating layer 105 may be formed over the oxide layer 115.

The oxide layer 115 is formed on the gate electrode 104 by an anodic oxidation method, and the oxide layer 115 is used as the gate insulating layer, thereby achieving a highly reliable semiconductor device.

Alternatively, an oxide layer may be formed on a surface of the electrode 102 by an anodic oxidation method.

This embodiment can be implemented by being combined as appropriate with any of the above-described embodiments.
(Embodiment 3)

This embodiment describes a structure example of a memory device as an example of a semiconductor device including the transistor disclosed in this specification, with reference to FIGS. 5A to 5D and FIG. 6.

Figure 5A:
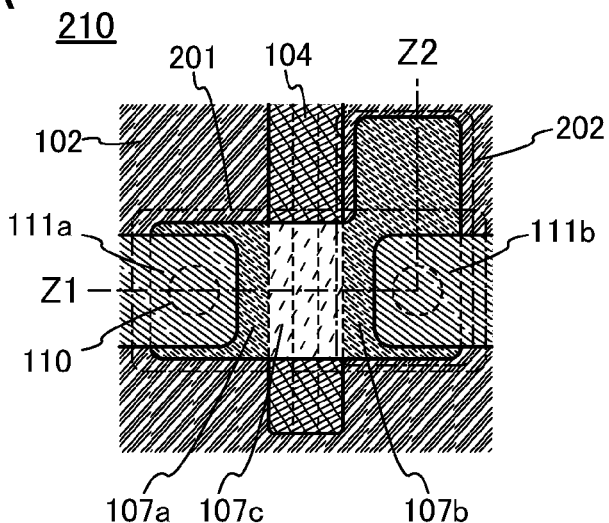
FIGS. 5A to 5D illustrate a structure of a semiconductor device.
Figure 5B:
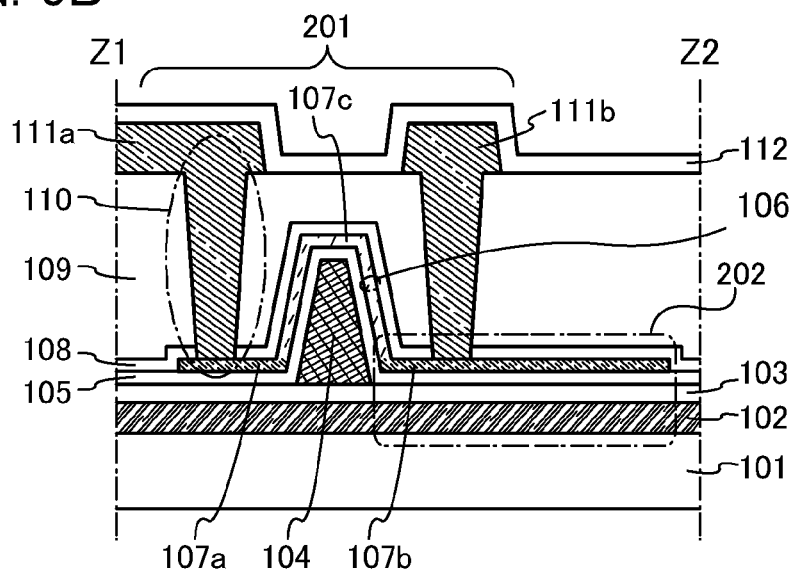
Figure 5C:
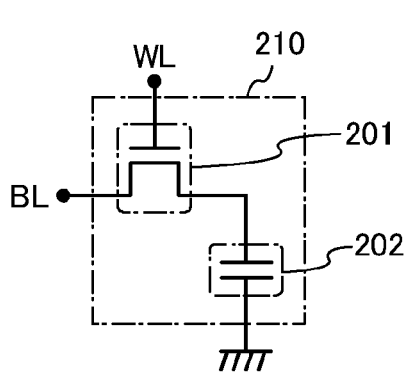
Figure 5D:
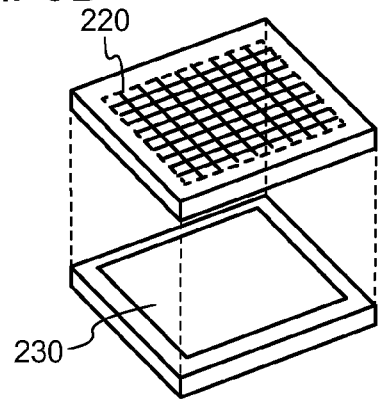

FIG. 5A is a top view of a memory cell 210 in a memory device. FIG. 5B is a cross-sectional view taken along Z1-Z2 in FIG. 5A. FIG. 5C is an equivalent circuit diagram of the memory cell 210. FIG. 5D is a conceptual view of a memory device including the memory cells 210. The memory cell 210 in this embodiment has a structure corresponding to a so-called DRAM (dynamic random access memory).

The memory cell 210 includes a transistor 201 and a capacitor 202. The transistor described in any of the above embodiments can be used as the transistor 201. The source and drain regions 107a and 107b in the transistor 201 are formed by supply of a potential to the electrode 102. The capacitor 202 is formed from the drain region 107b and the electrode 102 serving as electrodes and the insulating layer 103 and the gate insulating layer 105 serving as dielectric layers. Since the electrode 102 is formed in the entire area of the memory cell 210, the capacitance value of the capacitor 202 can be controlled by adjustment of the area of the drain region 107b. Further, since the electrode 102 can be used as one of the electrodes of the capacitor 202, an additional electrode for the capacitor is not needed, facilitating miniaturization of the memory cell 210.

In FIG. 5C, one of a source and a drain of the transistor 201 is electrically connected to a bit line BL, a gate of the transistor 201 is electrically connected to a word line WL, the other of the source and the drain of the transistor 201 is electrically connected to one of the electrodes of the capacitor 202, and the other of the electrodes of the capacitor 202 is electrically connected to a common electrode.

The transistor 200 hardly causes a short-channel effect even when the transistor 200 is miniaturized, so that electric charges accumulated in the capacitor 202 can be kept for a long period of time. With use of an oxide semiconductor for the semiconductor layer 106 (the layer including the source region 107a, the drain region 107b, and the channel formation region 107c) in the transistor 200, the off-state current of the transistor 200 can be extremely low. As a result, the electric charges accumulated in the capacitor 202 can be kept for a longer period of time.

Next, data writing and data holdin in the memory cell 210 will be described. First, the potential of the word line WL is set to a potential at which the transistor 201 is turned on, so that the transistor 201 is turned on. Accordingly, the potential of the bit line BL is supplied to one electrode of the capacitor 202 (writing). After that, the potential of the word line WL is set to a potential at which the transistor 201 is turned off, so that the transistor 201 is turned off. Thus, the potential of the one electrode of the capacitor 202 is held (holding).

Next, reading of data will be described. When the transistor 201 is turned on, the bit line BL which is in a floating state and the capacitor 202 are electrically connected to each other, and the charge is redistributed between the bit line BL and the capacitor 202. As a result, the potential of the bit line BL is changed. The amount of change in potential of the bit line BL varies depending on the potential of the one electrode of the capacitor 202 (or the charge accumulated in the capacitor 202).

For example, the potential of the bit line BL after charge redistribution is $(C_B \times V_{B0} + C \times V)/(C_B + C)$, where V is the potential of the one electrode of the capacitor 202, C is the capacitance of the capacitor 202, $C_B$ is the capacitance of the bit line BL (hereinafter also referred to as bit line capacitance), and $V_{B0}$ is the potential of the bit line BL before the charge redistribution. Therefore, it can be found that assuming that the memory cell 210 is in either of two states in which the potentials of the one electrode of the capacitor 202 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparison between the potential of the bit line BL and a predetermined potential, data can be read. Note that electric charges accumulated in the capacitor 202 are decreased by the data reading; accordingly, data writing is performed again after the data reading.

The semiconductor device in FIGS. 5A to 5D includes the transistor 201 which hardly causes a short-channel effect as described above; as a result, an increase in off-state current can be suppressed even when the transistor is miniaturized, and electric charges accumulated in the capacitor 202 can be kept for a long period of time. Since the impurity introduction step is not involved in the process for manufacturing the semiconductor device, the productivity of the semiconductor device can be improved.

With use of an oxide semiconductor for the semiconductor layer 106 in the transistor 201, the off-state current of the transistor 201 can be extremely low. Thus, electric charges accumulated in the capacitor 202 can be kept for a longer period of time. In other words, power consumption can be reduced because refresh operation becomes unnecessary or the frequency of refresh operation can become extremely low. Moreover, stored data can be held for a long period of time even when power is not supplied.

Next, the semiconductor device illustrated in FIG. 5D will be described. The memory device in FIG. 5D includes a memory cell array 220 including the memory cells 210 in the upper portion, and a driver circuit 230 which is need to operate the memory cell array 220 in the lower portion.

In the structure illustrated in FIG. 5D, the driver circuit 230 can be provided under the memory cell array 220. Thus, the size of the semiconductor device can be reduced.

With use of the transistor disclosed in this specification, a memory cell having a structure corresponding to SRAM (static random access memory) can be formed.

Figure 6:
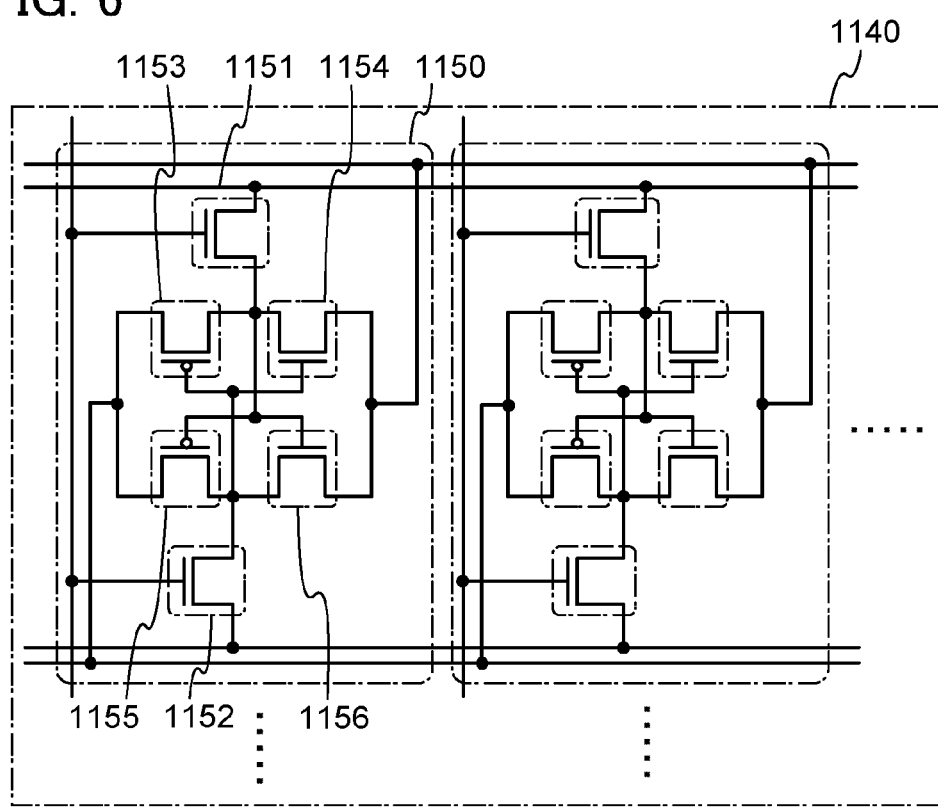
FIG. 6 illustrates a structure of a semiconductor device.

FIG. 6 illustrates a semiconductor device having a structure corresponding to SRAM. A memory cell array 1140 illustrated in FIG. 6 can have a structure in which a plurality of memory cells 1150 is arranged in a matrix. The memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-type transistor (here, the fourth transistor 1154 is an n-type transistor), and the other of the third transistor 1153 and the fourth transistor 1154 is a p-type transistor (here, the third transistor 1153 is a p-type transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors. The third transistor 1153 and the fifth transistor 1155 are p-channel transistors. A structure example of a CMOS circuit including the transistor disclosed in this specification will be described in detail in the other embodiment.

This embodiment can be implemented by being combined as appropriate with any of the above-described embodiments.
(Embodiment 4)

Figure 7A:
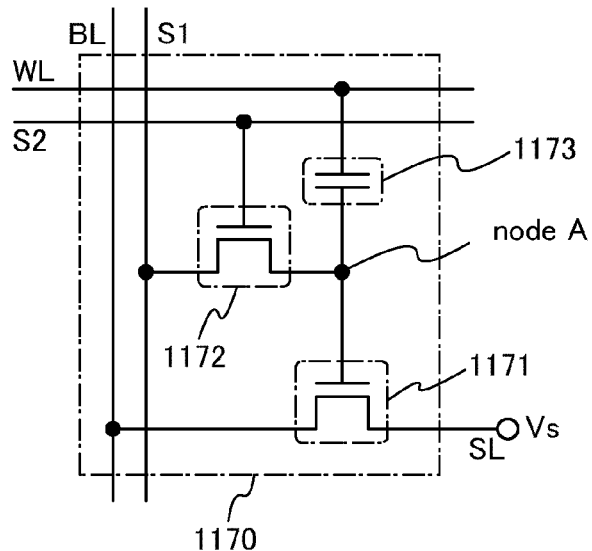
FIGS. 7A and 7B illustrate a structure of a semiconductor device.
Figure 7B:
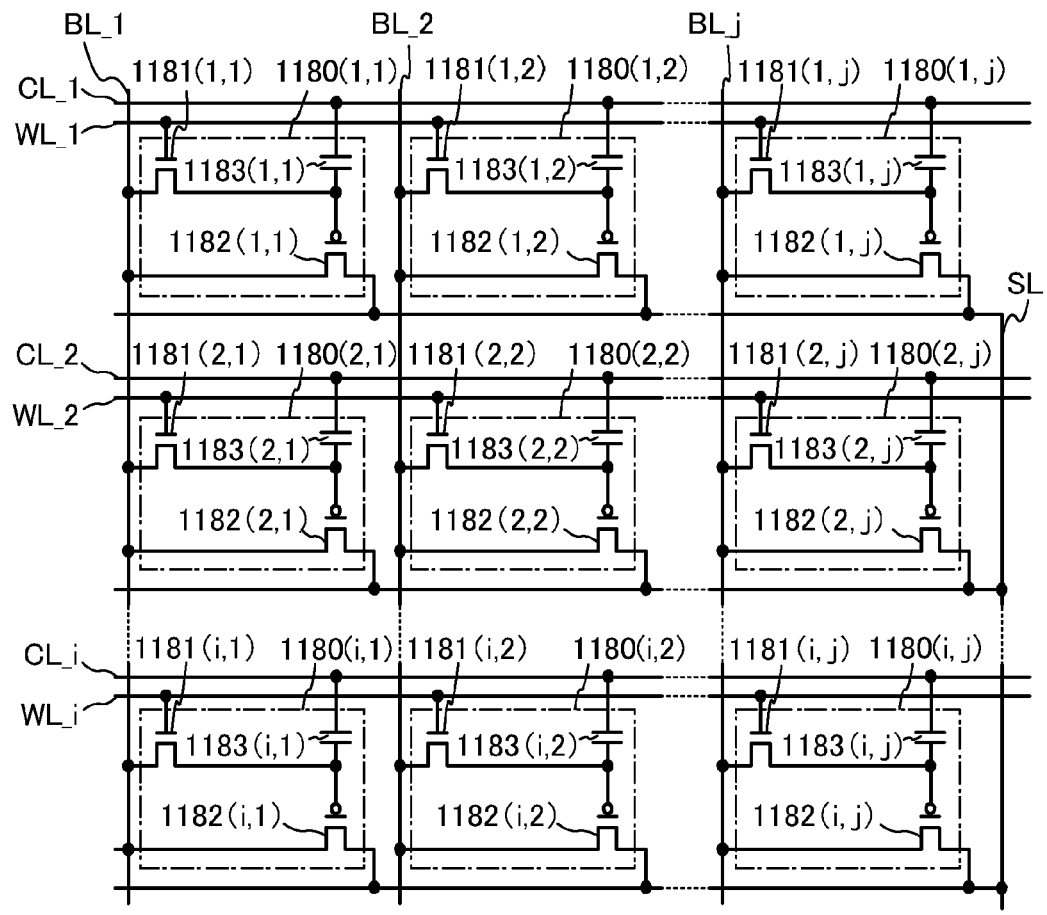

This embodiment describes an example of a memory cell whose structure is different from the structure of the memory cell in Embodiment 3 in conjunction with FIGS. 7A and 7B. A memory cell 1170 illustrated in FIG. 7A includes a first wiring SL, a second wiring BL, a third wiring 51, a fourth wiring S2, a fifth wiring WL, a transistor 1171 (a first transistor), a transistor 1172 (a second transistor), and a capacitor 1173.

The transistor described in any of the above embodiments can be used as the transistors 1171 and 1172. It is preferable to use an oxide semiconductor for a channel formation region in the transistor 1172.

Here, a gate electrode of the transistor 1171, one of a source electrode and a drain electrode of the transistor 1172, and one electrode of the capacitor 1173 are electrically connected to a node A. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off. As a result, the potential of the node A connected to the gate electrode of the transistor 1171 is set to approximately 2 V after the writing of data "1" and set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of the reading is set to 0 V; however, it may be in a floating state or may be charged to have a potential higher than 0 V. Data "1" and data "0" are defined for convenience and can be reversed.

The potential of the third wiring S1 at the time of writing may be selected from the potentials of data "0" and data "1" as long as the transistor 1172 is turned off after the writing and the transistor 1171 is in an off state in the case where the potential of the fifth wiring WL is set to 0 V. The potential of the fifth wiring WL at the time of reading is set so that the transistor 1171 is turned off in the case of data "0" and turned on in the case of data "1". Furthermore, the threshold voltage of the transistor 1171 is an example. The transistor 1171 can have any threshold voltage as long as the transistor 1171 can operate in the above-described manner.

An example of a NOR-type semiconductor memory device in which a memory cell including a capacitor and a selection transistor having a first gate electrode and a second gate electrode is used will be described with reference to FIG. 7B.

The memory cell array illustrated in FIG. 7B includes a plurality of memory cells 1180 arranged in matrix of i rows (i is a natural number of 3 or more) and j columns (j is a natural number of 3 or more), i word lines WL (word lines WL_1 to WL_i), i capacitor lines CL (capacitor lines CL_1 to CL_i), j bit lines BL (bit lines BL_1 to BL_j), and a source line SL.

Further, each of the plurality of memory cells 1180 (also referred to as a memory cell 1180(M,N) (note that M is a natural number greater than or equal to 1 and less than or equal to i and that N is a natural number greater than or equal to 1 and less than or equal to j)) includes a transistor 1181(M,N), a capacitor 1183(M,N), and a transistor 1182(M,N).

Note that in the semiconductor memory device, the capacitor includes a first capacitor electrode and a second capacitor electrode which face with a dielectric layer provided therebetween. Electric charge is accumulated in the capacitor in accordance with voltage applied between the first capacitor electrode and the second capacitor electrode.

The transistor 1181(M,N) is an n-type transistor, which has a source electrode, a drain electrode, a first gate electrode, and a second gate electrode. Note that in the semiconductor memory device in this embodiment, the transistor 1181 does not necessarily be an n-type transistor.

One of the source electrode and the drain electrode of the transistor 1181(M,N) is connected to a bit line BL_N. The first gate electrode of the transistor 1181(M,N) is connected to a word line WL_M. The second gate electrode of the transistor 1181(M,N) is connected to a gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-type transistor. Note that in the semiconductor memory device in this embodiment, the transistor 1182 does not necessarily be a p-type transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1181(M,N) is connected to the other of the source electrode and the drain electrode of the transistor 1182(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to a capacitor line CL_M. A second capacitor electrode of the capacitor 1183(M,N) is connected to the other of the source electrode and the drain electrode of the transistor 1181(M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The gate line driver circuit is formed using a circuit which includes a diode and a capacitor whose first capacitor electrode is electrically connected to an anode of the diode, for example.

The memory cell disclosed in this embodiment has a more complicated circuit configuration than the memory cell disclosed in Embodiment 3; however, electric charges accumulated in the capacitor 1173 are not decreased in data reading, so that data rewriting after the data reading is not necessary. Therefore, the memory cell disclosed in this embodiment can operate with lower power consumption than the memory cell disclosed in Embodiment 3.

The transistor in any of the above embodiments, which hardly causes a short-channel effect even when the transistor is miniaturized, is applied to the memory cell disclosed in this embodiment, thereby achieving a semiconductor device with less increase in off-state current and lower power consumption even when the semiconductor device is miniaturized. In addition, the potential of the node A can be kept for a long period of time. Further, since an impurity introduction step is unnecessary in the process for manufacturing the semiconductor device, the productivity of the semiconductor device can be improved.

Since the off-state current of the transistor 1172 can be extremely low by using an oxide semiconductor for the channel formation region in the transistor 1172, the potential of the node A can be kept for a longer period of time. In other words, power consumption can be reduced because refresh operation becomes unnecessary or the frequency of refresh operation can become extremely low. Moreover, stored data can be held for a long period of time even when power is not supplied.

This embodiment can be implemented by being combined as appropriate with any of the above-described embodiments.
(Embodiment 5)

Figure 8A:
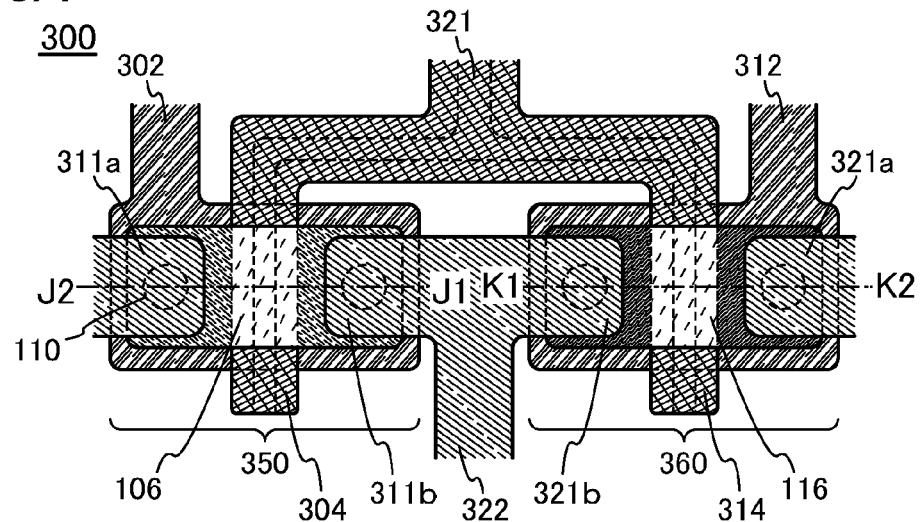
FIGS. 8A to 8C illustrate a structure of a semiconductor device.
Figure 8B:
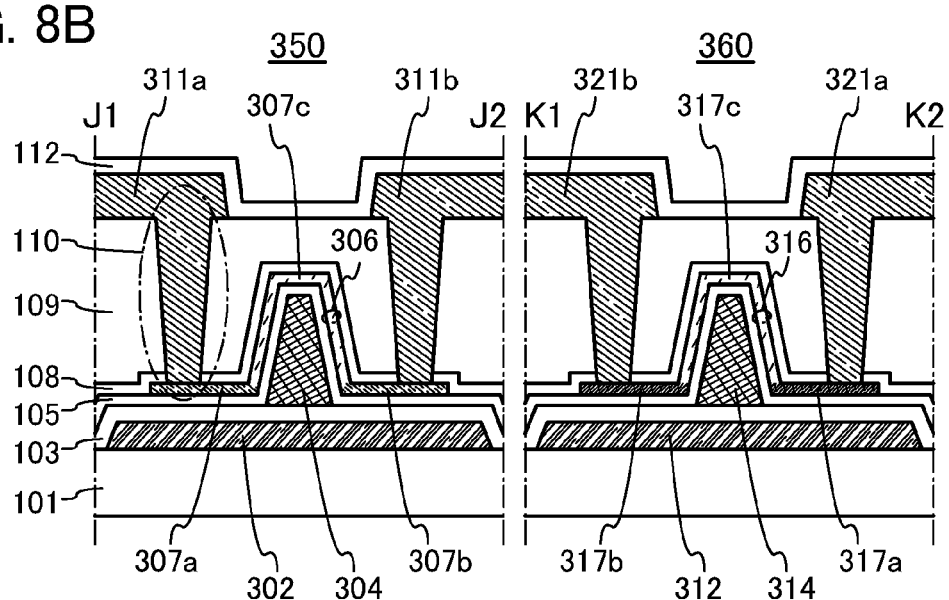
Figure 8C:
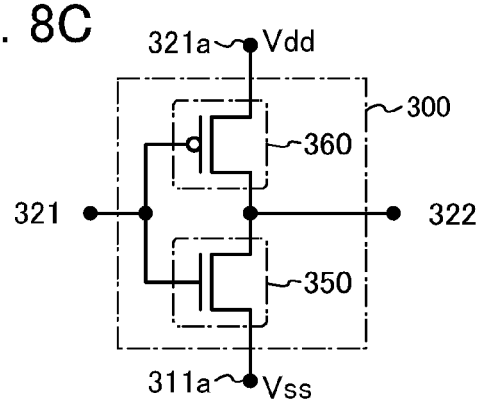

This embodiment describes a structure example of an inverter circuit including the transistor disclosed in this specification with reference to FIGS. 8A to 8C.

FIG. 8A is a top view of an inverter circuit 300. FIG. 8B is a cross-sectional view taken along J1-J2 and K1-K2 in FIG. 8A. Note that the cross-section J1-J2 corresponds to the cross section of a transistor 350 in the channel length direction, and the cross-section K1-K2 corresponds to the cross section of a transistor 360 in the channel length direction. FIG. 8C is an equivalent circuit diagram of the inverter circuit 300.

The inverter circuit 300 includes the transistors 350 and 360. The transistor 350 includes an electrode 302 over a substrate 101, and the transistor 360 includes an electrode 312 over the substrate 101. The electrodes 302 and 312 have the same functions as the electrode 102 described in the above embodiments. The electrodes 302 and 312 can be formed by selective etching of the electrode 102 through a photolithography process.

A gate electrode 304 and a gate electrode 314 can be formed with use of the material used for the gate electrode 104 described in the above embodiments by the method applied to formation of the gate electrode 104. A semiconductor layer 306 and a semiconductor layer 316 can be formed with use of the material used for the semiconductor layer 106 described in the above embodiments by the method applied to formation of the semiconductor layer 106. A source electrode 311a, a drain electrode 311b, a source electrode 321a, and a drain electrode 321b can be formed with use of the material used for the source and drain electrodes 111a and 111b described in the above embodiments by the method applied to formation of the source and drain electrodes 111a and 111b. Note that the contact holes 110 are formed over a region to be a source region 307a and a region to be a drain region 307b in the semiconductor layer 306 and over a region to be a source region 317a and a region to be a drain region 317b in the semiconductor layer 316.

The gate electrodes 304 and 314 are electrically connected to an input terminal 321. The drain electrodes 311b and 321b are electrically connected to an output terminal 322.

In this embodiment, a material which can be an n-type or p-type semiconductor in accordance with an applied electric field is used for the semiconductor layers 306 and 316. In this embodiment, microcrystalline silicon is used for the semiconductor layers 306 and 316.

Supply of a positive potential to the electrode 302 in the transistor 350 enables formation of the source and drain regions 307a and 307b which have n-type conductivity in the semiconductor layer 306 overlapping with the electrode 302. In addition, a region in the semiconductor layer 306, which faces the gate electrode 304 with the gate insulating layer 105 provided therebetween, becomes a channel formation region 307c. Supply of a negative potential to the electrode 312 in the transistor 360 enables formation of the source and drain regions 317a and 317b which have p-type conductivity in the semiconductor layer 316 overlapping with the electrode 312. In addition, a region in the semiconductor layer 316, which faces the gate electrode 314 with the gate insulating layer 105 provided therebetween, becomes a channel formation region 317c.

Therefore, the transistor 350 can operate as an n-type transistor (n-channel transistor), and the transistor 360 can operate as a p-type transistor (p-channel transistor). The use of the transistor disclosed in this specification makes it possible to form a CMOS circuit without performing an impurity introduction step.

The resistance values of the source regions 307a and 317a and the drain regions 307b and 317b can be changed depending on potentials supplied to the electrodes 302 and 312. In addition, the conductivity types of the transistor 350 and the transistor 360 can be exchanged or can be the same by setting potentials supplied to the electrode 302 and the electrode 312.

Next, operation of the inverter circuit 300 will be described. A power supply potential Vss is supplied to the source electrode 311a in the transistor 350 operating as an n-type transistor. A power supply potential Vdd is supplied to the source electrode 321a in the transistor 360 operating as a p-type transistor. Note that the power supply potential Vdd is relatively higher than the power supply potential Vss.

When the power supply potential Vdd is supplied to the input terminal 321, the power supply potential Vdd is supplied to the gate electrodes of the transistors 350 and 360. At this time, the transistor 360 operating as a p-type transistor is turned off. On the other hand, the transistor 350 operating as an n-type transistor is turned on, so that electrical continuity between the source electrode 311a and the drain electrode 311b is established, and the power supply potential Vss is output from the output terminal 322.

When the power supply potential Vss is supplied to the input terminal 321, the power supply potential Vss is supplied to the gate electrodes of the transistors 350 and 360. At this time, the transistor 350 operating as an n-type transistor is turned off. On the other hand, the transistor 360 operating as a p-type transistor is turned on, so that electrical continuity between the source electrode 321a and the drain electrode 321b is established, and the power supply potential Vdd is output from the output terminal 322.

Since the inverter circuit 300 inverts an input signal and outputs the inverted signal in this manner, the inverter circuit 300 is also called NOT circuit. The current value of the output signal can be increased and decreased by adjustment of the channel widths of the transistors 350 and 360. In addition, a waveform of a pulse signal in which amplitude distortion or amplitude decay is caused for some reason can be corrected.

The inverter circuit 300 can be used as a buffer circuit by an exchange of the potentials supplied to the electrodes 302 and 312.

Since the inverter circuit 300 disclosed in this embodiment includes a transistor which hardly causes a short-channel effect even when the transistor is miniaturized, the standby power consumption can be reduced. The use of the inverter circuit 300 disclosed in this embodiment also makes it possible to provide a semiconductor device which is easily and highly integrated. Further, since an impurity introduction step is unnecessary in the process for manufacturing the semiconductor device, the productivity of the semiconductor device can be improved.

This embodiment can be implemented by being combined as appropriate with any of the above-described embodiments.

(Embodiment 6)

Figure 9A:
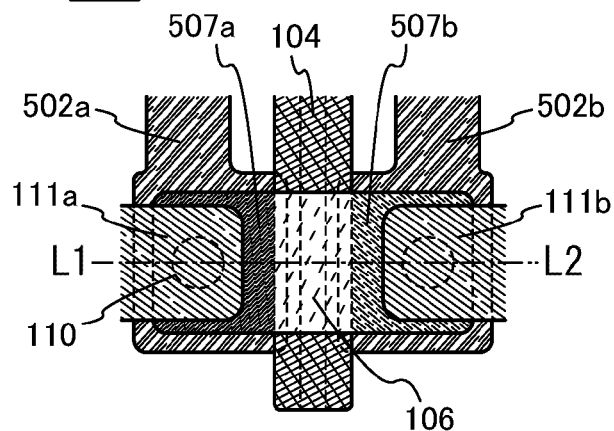
FIGS. 9A to 9C illustrate a structure of a semiconductor device.
Figure 9B:
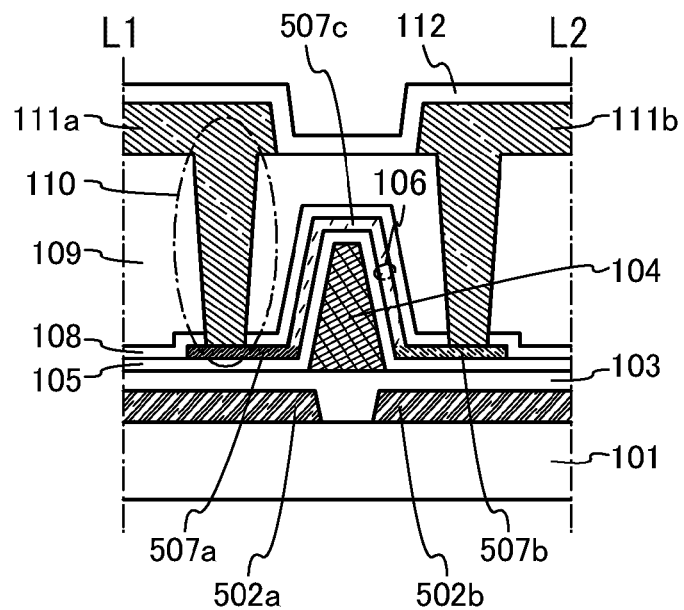
Figure 9C:
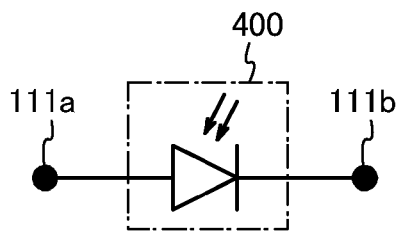

This embodiment describes a structure of a photoelectric conversion element as an example of the semiconductor device disclosed in this specification, referring to FIGS. 9A to 9C.

FIG. 9A is a top view of a photoelectric conversion element 400. FIG. 9B is a cross-sectional view taken along L1-L2 in FIG. 9A. Note that the cross-section L1-L2 corresponds to the cross section of the photoelectric conversion element 400 in the channel length direction. FIG. 9C is an equivalent circuit diagram of the photoelectric conversion element 400.

The photoelectric conversion element 400 includes an electrode 502a and an electrode 502b over the substrate 101. The electrodes 502a and 502b can be formed by selective etching of the electrode 102, which is described in the above embodiments, through a photolithography process. The structures and the manufacturing methods of the other components can be the same as those of the transistor described in any of the above embodiments.

The conductivity type of a first region 507a in the semiconductor layer 106, which overlaps with the electrode 502a, is determined in accordance with a potential supplied to the electrode 502a. The conductivity type of a second region 507b in the semiconductor layer 106, which overlaps with the electrode 502b, is determined in accordance with a potential supplied to the electrode 502b. In this embodiment, the first region 507a is made to be a p-type semiconductor region by supply of a negative potential to the electrode 502a; the second region 507b is made to be an n-type semiconductor region by supply of a positive potential to the electrode 502b. A third region 507c in the semiconductor layer 106, which faces the gate electrode 104 with the gate insulating layer 105 provided therebetween, remains an i-type semiconductor. In this manner, a p-type semiconductor region, an i-type semiconductor region, and an n-type semiconductor region can be formed in the semiconductor layer 106.

When the i-type semiconductor region is irradiated with light, holes and electrons in the i-type semiconductor region are excited, so that the holes transfer to the p-type semiconductor region and the electrons transfer to the n-type semiconductor region. By utilizing this phenomenon, the photoelectric conversion element 400 can be used as a photosensor or a solar cell. Further, adjustment of the potential of the gate electrode 104 makes it possible to control the photosensitivity of the photoelectric conversion element 400.

By supply of a positive potential or a negative potential to both the electrodes 502a and 502b, the photoelectric conversion element can operate as a transistor. Therefore, in the semiconductor device disclosed in this embodiment, the function of a semiconductor element can be changed as needed and the semiconductor element can be used as an n-type transistor, a p-type transistor, or a photoelectric conversion element.

This embodiment can be implemented by being combined as appropriate with any of the above-described embodiments.

(Embodiment 7)

A central processing unit (CPU) can be formed with use of the transistor disclosed in this specification for at least part of the CPU.

Figure 10A:
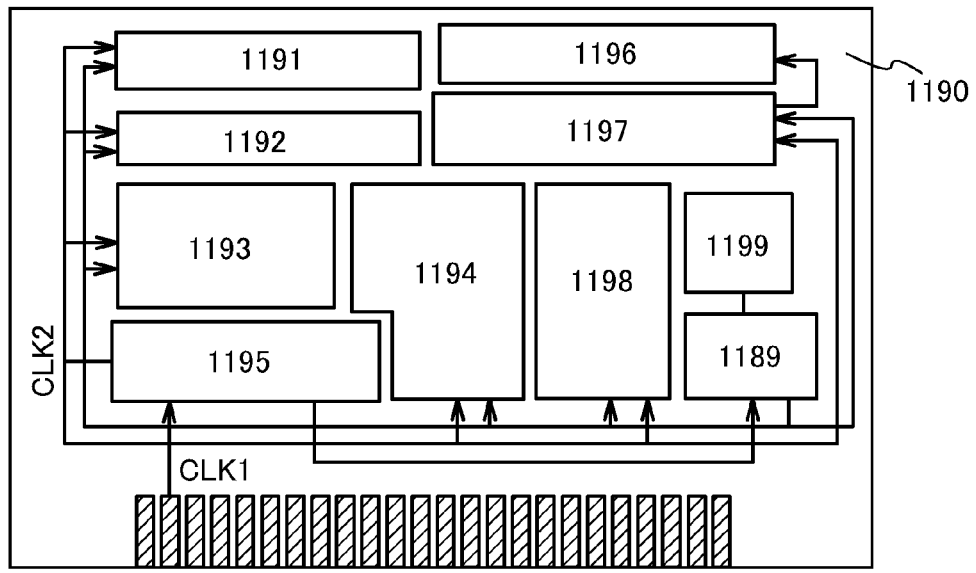
FIGS. 10A to 10C illustrate specific examples of CPUs.

FIG. 10A is a block diagram illustrating a specific structure of a CPU. The CPU illustrated in FIG. 10A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 10A is only an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 10A, a memory element is provided in the register 1196. The memory device described in any of the above embodiments can be used as the memory element provided in the register 1196.

In the CPU illustrated in FIG. 10A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 10B:
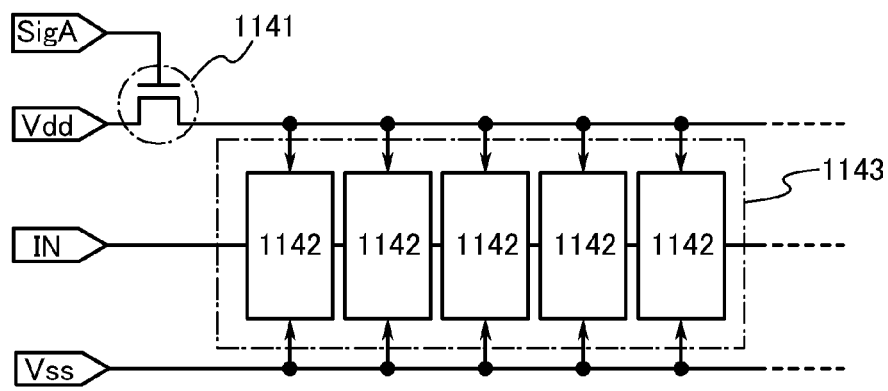
Figure 10C:
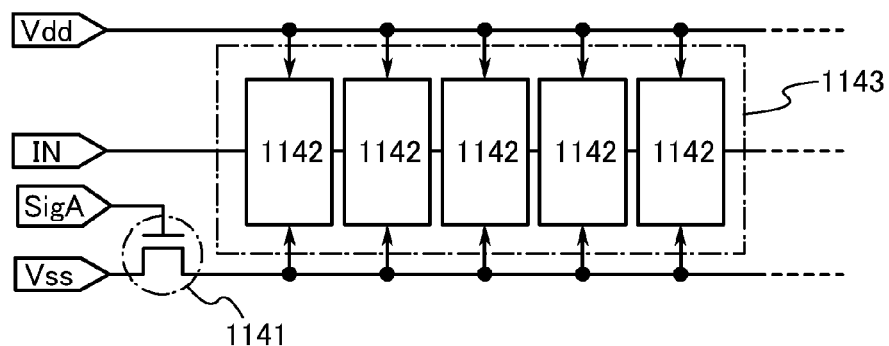

The power supply can be stopped by providing a switching element between a memory element group and a node to which a power supply potential Vdd or a power supply potential Vss is supplied, as illustrated in FIG. 10B or FIG. 10C. Circuits illustrated in FIGS. 10B and 10C are described below.

FIGS. 10B and 10C each illustrate an example of a structure of a memory circuit including a transistor in which a channel formation region is formed using an oxide semiconductor as a switching element for controlling supply of a power supply potential to a memory element.

The memory device illustrated in FIG. 10B includes a switching element 1141 and a memory element group 1143 including a plurality of memory elements 1142. Specifically, as each of the memory elements 1142, the memory device described in any of the above embodiments can be used. Each of the memory elements 1142 included in the memory element group 1143 is supplied with the power supply potential Vdd via the switching element 1141. Further, each of the memory elements 1142 included in the memory element group 1143 is supplied with a potential of a signal IN and the power supply potential Vss.

In FIG. 10B, a transistor is used as the switching element 1141, and the switching of the transistor is controlled by a signal Sig A supplied to a gate electrode thereof.

Note that FIG. 10B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the power supply potential Vdd to each of the memory elements 1142 included in the memory element group 1143 in FIG. 10B, the switching element 1141 may control the supply of the power supply potential Vss.

In FIG. 10C, an example of a memory device in which each of the memory elements 1142 included in the memory element group 1143 is supplied with the power supply potential Vss via the switching element 1141 is illustrated. The supply of the power supply potential Vss to each of the memory elements 1142 included in the memory element group 1143 can be controlled by the switching element 1141.

When a switching element is provided between a memory element group and a node to which the power supply potential Vdd or the power supply potential Vss is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented by being combined as appropriate with any of the above-described embodiments.

(Embodiment 8)

In this embodiment, an example of an electronic device including the semiconductor device described in the above embodiments will be described.

Figure 11A:
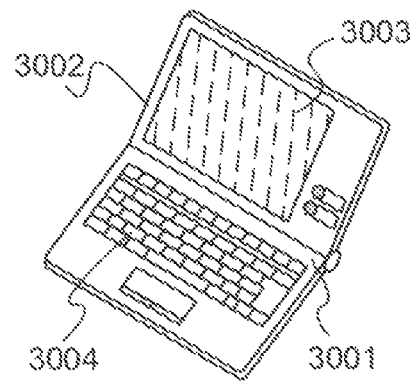
FIGS. 11A to 11F illustrate examples of electronic apparatuses.

FIG. 11A illustrates a laptop personal computer, which includes a main body 3001, a housing 3002, a display portion 3003, a keyboard 3004, and the like. Any of the semiconductor devices disclosed in this specification can be applied to a semiconductor device such as a memory device or a CPU included in the laptop personal computer. With use of the semiconductor device disclosed in this specification, a highly reliable laptop personal computer with low power consumption can be obtained. The transistor disclosed in this specification can also be applied to a pixel transistor included in the display portion 3003.

Figure 11B:
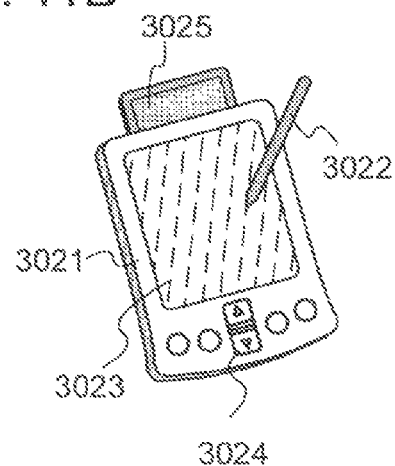

FIG. 11B illustrates a personal digital assistant (PDA) including a display portion 3023, an external interface 3025, an operation button 3024, and the like in a main body 3021. A stylus 3022 is included as an accessory for operation. Any of the semiconductor devices disclosed in this specification can be applied to a semiconductor device such as a memory device or a CPU included in the PDA. With use of the semiconductor device disclosed in this specification, a highly reliable PDA with low power consumption can be obtained. The transistor disclosed in this specification can also be applied to a pixel transistor included in the display portion 3023.

Figure 11C:
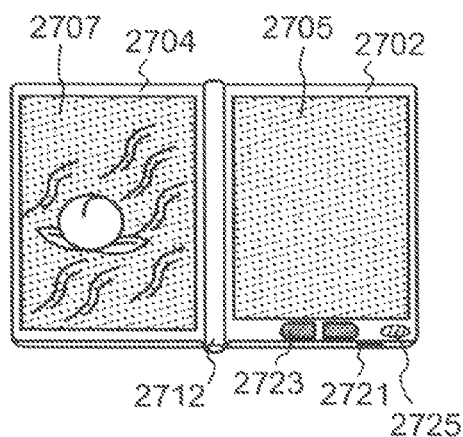

FIG. 11C illustrates an example of an e-book reader. For example, the e-book reader includes two housings, a housing 2702 and a housing 2704. The housing 2702 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2702 and the housing 2704, respectively. The display portion 2705 and the display portion 2707 may display one image or different images. In the case where the display portion 2705 and the display portion 2707 display different images, for example, a display portion on the right side (the display portion 2705 in FIG. 11C) can display text and a display portion on the left side (the display portion 2707 in FIG. 11C) can display graphics. Any of the semiconductor devices disclosed in this specification can be applied to a semiconductor device such as a memory device or a CPU included in the e-book reader. With use of the semiconductor device disclosed in this specification, a highly reliable e-book reader with low power consumption can be obtained. The transistor disclosed in this specification can also be applied to pixel transistors included in the display portions 2705 and 2707

FIG. 11C illustrates an example in which the housing 2702 is provided with an operation portion and the like. For example, the housing 2702 is provided with a power supply terminal 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the electronic book device may have a function of an electronic dictionary.

The electronic book device may transmit and receive data wirelessly. Through wireless communication, desired book data or the like can be purchased and downloaded from an electronic book server.

Figure 11D:
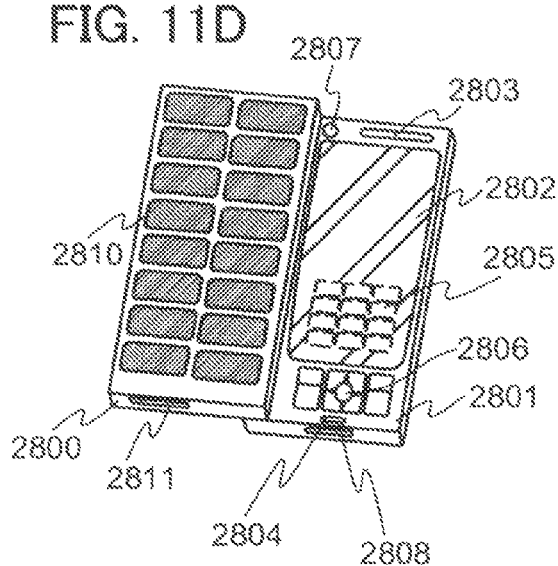

FIG. 11D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. Any of the semiconductor devices disclosed in this specification can be applied to a semiconductor device such as a memory device or a CPU included in the mobile phone. With use of the semiconductor device disclosed in this specification, a highly reliable mobile phone with low power consumption can be obtained. The transistor disclosed in this specification can also be applied to a pixel transistor included in the display panel 2802. In addition, the housing 2800 includes a solar cell 2810 having a function of charge of the portable information terminal, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 11D. Note that a boosting circuit by which a voltage output from the solar cell 2810 is increased to be sufficiently high for each circuit is also included. The photoelectric conversion element disclosed in Embodiment 6 can be applied to the solar cell 2810.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the semiconductor device described in any of the above embodiments, a mobile phone in which power consumption is low and reliability is high can be provided.

Figure 11E:
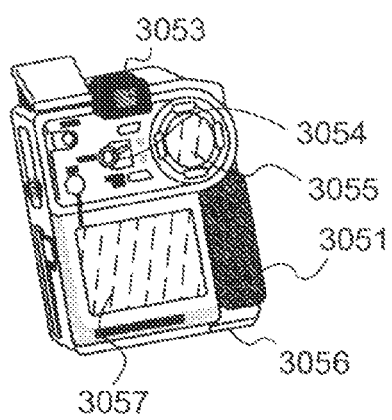

FIG. 11E is a digital video camera including a main body 3051, a display portion A 3057, an eye piece 3053, an operation switch 3054, a display portion B 3055, a battery 3056, and the like. Any of the semiconductor devices disclosed in this specification can be applied to a semiconductor device such as a memory device or a CPU included in the digital video camera. With use of the semiconductor device disclosed in this specification, a highly reliable digital video camera with low power consumption can be obtained. The transistor disclosed in this specification can also be applied to pixel transistors included in the display portion A 3057 and the display portion B 3055.

Figure 11F:
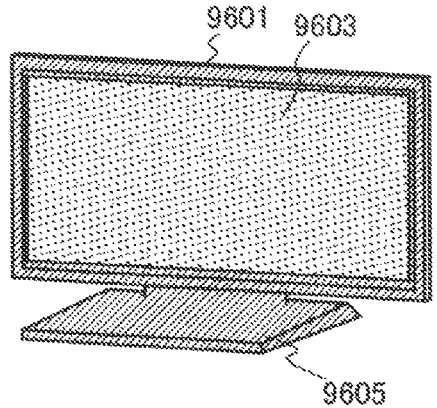

FIG. 11F illustrates an example of a television set. In the television set in FIG. 11F, a display portion 9603 is incorporated in a housing 9601. The display portion 9603 can display images. Here, the housing 9601 is supported by a stand 9605. Any of the semiconductor devices disclosed in this specification can be applied to a semiconductor device such as a memory device or a CPU included in the television set. With use of the semiconductor device disclosed in this specification, a highly reliable television set with low power consumption can be obtained. The transistor disclosed in this specification can also be applied to pixel transistors included in the display portion 9603.

The television set can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

This application is based on Japanese Patent Application serial no. 2011-050032 filed with Japan Patent Office on Mar. 8, 2011, the entire contents of which are hereby incorporated by reference.

What is claimed is:

1. A semiconductor device comprising:
a substrate;
a first electrode over the substrate;
an insulating layer over the first electrode;
a gate electrode over the insulating layer;
a gate insulating layer over the insulating layer and the gate electrode;
a semiconductor layer over the gate insulating layer; and
a second electrode in direct contact with the semiconductor layer,
wherein the semiconductor layer includes a first region and a second region in direct contact with the gate insulating layer, and the first region and the second region face the first electrode,
wherein the semiconductor layer includes a third region between the first region and the second region, and the third region faces the gate electrode,
wherein the first electrode and the second electrode overlap each other with the gate insulating layer provided therebetween, and
wherein a height of the gate electrode is greater than or equal to a length of a lower base of the gate electrode in a cross section of the gate electrode.

2. The semiconductor device according to claim 1, wherein the gate insulating layer contains an element which is the same as an element contained in the gate electrode.

3. The semiconductor device according to claim 1, wherein a channel is formed in the third region.

4. The semiconductor device according to claim 3, wherein a length of the channel is twice or more the length of the lower base of the gate electrode.

5. A semiconductor device comprising:
a substrate;
a first electrode over the substrate;
an insulating layer over the first electrode;
a gate electrode over the insulating layer;
a gate insulating layer over the insulating layer and the gate electrode;
an oxide semiconductor layer over the gate insulating layer; and
a second electrode in direct contact with the oxide semiconductor layer,
wherein the oxide semiconductor layer includes a first region and a second region in direct contact with the gate insulating layer, and the first region and the second region face the first electrode,
wherein the oxide semiconductor layer includes a third region between the first region and the second region, and the third region faces the gate electrode,
wherein the first electrode and the second electrode overlap each other with the gate insulating layer provided therebetween, and
wherein a height of the gate electrode is greater than or equal to a length of a lower base of the gate electrode in a cross section of the gate electrode.

6. The semiconductor device according to claim 5, wherein the gate insulating layer contains an element which is the same as an element contained in the gate electrode.

7. The semiconductor device according to claim 5, wherein a channel is formed in the third region.

8. The semiconductor device according to claim 7, wherein a length of the channel is twice or more the length of the lower base of the gate electrode.

9. A semiconductor device comprising:
a substrate;
a first electrode and a second electrode apart from each other over the substrate;
an insulating layer over the first electrode and the second electrode;
a first gate electrode over the insulating layer, the first gate electrode facing the first electrode;
a second gate electrode over the insulating layer, the second gate electrode facing the second electrode;
a first gate insulating layer over the insulating layer and the first gate electrode;
a second gate insulating layer over the insulating layer and the second gate electrode;
a first semiconductor layer over the first gate insulating layer;
a second semiconductor layer over the second gate insulating layer;
a third electrode in direct contact with the first semiconductor layer; and
a fourth electrode in direct contact with the second semiconductor layer,
wherein the first semiconductor layer includes a first region and a second region which face the first electrode,
wherein the first semiconductor layer includes a third region between the first region and the second region, and the third region faces the first gate electrode,
wherein the second semiconductor layer includes a fourth region and a fifth region which face the second electrode,
wherein the second semiconductor layer includes a sixth region between the fourth region and the fifth region, and the sixth region faces the second gate electrode,
wherein the first electrode and the third electrode overlap each other with the first gate insulating layer provided therebetween,
wherein the second electrode and the fourth electrode overlap each other with the second gate insulating layer provided therebetween,
wherein a height of the first gate electrode is greater than or equal to a length of a lower base of the first gate electrode in a cross section of the first gate electrode, and
wherein a height of the second gate electrode is greater than or equal to a length of a lower base of the second gate electrode in a cross section of the second gate electrode.

10. The semiconductor device according to claim 9,
wherein the first gate insulating layer contains an element which is the same as an element contained in the first gate electrode, and
wherein the second gate insulating layer contains an element which is the same as an element contained in the second gate electrode.

11. The semiconductor device according to claim 9,
wherein a conductivity type of the first region differs from a conductivity type of the fourth region, and
wherein a conductivity type of the second region differs from a conductivity type of the fifth region.

12. The semiconductor device according to claim 9,
wherein a first channel is formed in the third region, and
wherein a second channel is formed in the sixth region.

13. The semiconductor device according to claim 12,
wherein a length of the first channel is twice or more the length of the lower base of the first gate electrode, and
wherein a length of the second channel is twice or more the length of the lower base of the second gate electrode.

14. A semiconductor device comprising:
a substrate;
a first electrode and a second electrode apart from each other over the substrate;
an insulating layer over the first electrode and the second electrode;
a first gate electrode over the insulating layer, the first gate electrode facing the first electrode;
a second gate electrode over the insulating layer, the second gate electrode facing the second electrode;
a first gate insulating layer over the insulating layer and the first gate electrode;
a second gate insulating layer over the insulating layer and the second gate electrode;
a first oxide semiconductor layer over the first gate insulating layer;
a second oxide semiconductor layer over the second gate insulating layer;
a third electrode in direct contact with the first oxide semiconductor layer; and
a fourth electrode in direct contact with the second oxide semiconductor layer,
wherein the first oxide semiconductor layer includes a first region and a second region which face the first electrode,
wherein the first oxide semiconductor layer includes a third region between the first region and the second region, and the third region faces the first gate electrode,
wherein the second oxide semiconductor layer includes a fourth region and a fifth region which face the second electrode,
wherein the second oxide semiconductor layer includes a sixth region between the fourth region and the fifth region, and the sixth region faces the second gate electrode,
wherein the first electrode and the third electrode overlap each other with the first gate insulating layer provided therebetween,
wherein the second electrode and the fourth electrode overlap each other with the second gate insulating layer provided therebetween,
wherein a height of the first gate electrode is greater than or equal to a length of a lower base of the first gate electrode in a cross section of the first gate electrode, and
wherein a height of the second gate electrode is greater than or equal to a length of a lower base of the second gate electrode in a cross section of the second gate electrode.

15. The semiconductor device according to claim 14,
wherein the first gate insulating layer contains an element which is the same as an element contained in the first gate electrode, and
wherein the second gate insulating layer contains an element which is the same as an element contained in the second gate electrode.

16. The semiconductor device according to claim 14,
wherein a conductivity type of the first region differs from a conductivity type of the fourth region, and
wherein a conductivity type of the second region differs from a conductivity type of the fifth region.

17. The semiconductor device according to claim 14,
wherein a first channel is formed in the third region, and
wherein a second channel is formed in the sixth region.

18. The semiconductor device according to claim 17, wherein a length of the first channel is twice or more the length of the lower base of the first gate electrode, and wherein a length of the second channel is twice or more the length of the lower base of the second gate electrode.

* * * * *